US011637533B2

(12) United States Patent
Nam

(10) Patent No.: US 11,637,533 B2
(45) Date of Patent: Apr. 25, 2023

(54) AMPLIFIER AND ELECTRONIC DEVICE INCLUDING AMPLIFIER

(71) Applicant: SAMSUNG ELECTRONICS CO., LTD., Suwon-si (KR)

(72) Inventor: Hyunseok Nam, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 82 days.

(21) Appl. No.: 17/240,630

(22) Filed: Apr. 26, 2021

(65) Prior Publication Data
US 2022/0109408 A1 Apr. 7, 2022

(30) Foreign Application Priority Data

Oct. 7, 2020 (KR) .................. 10-2020-0129164

(51) Int. Cl.
H03F 1/30 (2006.01)
H03F 3/45 (2006.01)
H04R 3/02 (2006.01)
G09G 3/20 (2006.01)

(52) U.S. Cl.
CPC ............ *H03F 1/301* (2013.01); *G09G 3/20* (2013.01); *H03F 3/45264* (2013.01); *H04R 3/02* (2013.01); G09G 2310/0291 (2013.01); H03F 2200/447 (2013.01); H04R 2499/11 (2013.01); H04R 2499/13 (2013.01); H04R 2499/15 (2013.01)

(58) Field of Classification Search
CPC ..................................................... H03F 1/30
See application file for complete search history.

(56) References Cited

U.S. PATENT DOCUMENTS

| 4,042,886 | A | * | 8/1977 | Hanna | H03F 1/34 |
|---|---|---|---|---|---|
| | | | | | 323/280 |
| 5,686,826 | A | * | 11/1997 | Kurtz | G01L 1/2281 |
| | | | | | 323/365 |
| 6,407,623 | B1 | | 6/2002 | Bazarjani et al. | |
| 6,507,246 | B1 | | 1/2003 | Brokaw | |
| 7,576,610 | B2 | | 8/2009 | Dalena | |
| 7,944,309 | B2 | | 5/2011 | Cao | |
| 9,083,287 | B2 | | 7/2015 | Papamichail | |
| 10,348,260 | B2 | | 7/2019 | Oishi | |
| 10,359,794 | B2 | | 7/2019 | Ates | |
| 2018/0358933 | A1 | * | 12/2018 | Matsui | H03F 3/72 |
| 2019/0379372 | A1 | | 12/2019 | Mou et al. | |
| 2021/0257973 | A1 | * | 8/2021 | Umemoto | H03F 1/302 |
| 2021/0391830 | A1 | * | 12/2021 | Xiong | H03F 1/30 |
| 2022/0069711 | A1 | * | 3/2022 | Karri | H02M 1/0016 |

* cited by examiner

Primary Examiner — Olisa Anwah
(74) Attorney, Agent, or Firm — Volentine, Whitt & Francos, PLLC

(57) ABSTRACT

An amplifier includes an input circuit that amplifies a difference between a first input voltage and a second input voltage to generate a first current and a second current. A positive feedback circuit amplifies a difference between the first current and the second current to generate a third current and a fourth current and outputs a difference between the third current and the fourth current through an output node. A temperature compensation circuit adjusts an amplification factor of the positive feedback circuit in response to a change of temperature.

20 Claims, 12 Drawing Sheets

AMPLIFIER AND ELECTRONIC DEVICE INCLUDING AMPLIFIER

CROSS-REFERENCE TO RELATED APPLICATIONS

This application claims priority under 35 U.S.C. § 119 to Korean Patent Application No. 10-2020-0129164 filed on Oct. 7, 2020, in the Korean Intellectual Property Office, the disclosure of which is incorporated by reference herein in its entirety.

BACKGROUND

Embodiments of the present disclosure described herein relate to an electronic device, and more particularly, relate to an amplifier compensating for a change according to temperature and a voltage and an electronic device including the amplifier.

An amplifier may amplify a difference between input voltages or a difference between input currents and may output the amplified difference as a voltage or a current. The amplifier may be used in various components of electronic devices. In particular, the amplifier may be used in components for controlling power of an electronic device.

An operation of the amplifier is performed in an analog manner. Accordingly, factors such as a change of an ambient temperature and a change of a power supply voltage may influence the operation of the amplifier. For example, as temperature and a voltage vary, an amplification factor of the amplifier may vary. The sensitivity of the amplifier may influence performances of components including the amplifier and a performance of an electronic device including the amplifier.

In particular, the amplifier may be mainly used in a compensation circuit within the electronic device, and thus, a change of the amplification factor of the amplifier may decrease the stability of the electronic device including the amplifier. Accordingly, there is a demand for an amplifier that is not influenced by environmental changes, such as temperature change and a voltage change, or capable of compensating for an environmental change, at the very least.

SUMMARY

Embodiments of the present disclosure provide an amplifier that having no influence of temperature change by compensating for the temperature change. Embodiments of the present disclosure also provide an amplifier having no influence of a voltage change by compensating for the voltage change.

According to an embodiment, an amplifier includes an input circuit that amplifies a difference between a first input voltage and a second input voltage to generate a first current and a second current. A positive feedback circuit amplifies a difference between the first current and the second current to generate a third current and a fourth current and outputs a difference between the third current and the fourth current through an output node. A temperature compensation circuit adjusts an amplification factor of the positive feedback circuit in response to a change of temperature.

According to an embodiment, an electronic device includes an amplifier, a temperature compensation circuit that compensates for a change of an amplification factor of the amplifier due to a change of temperature, and a voltage compensation circuit that compensates for a change of the amplification factor of the amplifier due to a change of a power supply voltage. The amplifier includes a current source, a first transistor that generates a first current from the current source in response to a first input voltage, a second transistor that generates a second current from the current source in response to a second input voltage, a first current mirror that sinks a third current based on the first current, a second current mirror that sinks a fourth current based on the second current, a first transistor that includes a first terminal at which the third current is generated, a second terminal connected with the temperature compensation circuit, and a gate connected with a second node at which the second current is generated, a second transistor that includes a first terminal connected with the second node, a second terminal connected with the temperature compensation circuit, and a gate connected with the first node, a third current mirror that is connected with the first node and generates a fifth current based on the first current and a current flowing through the first transistor, a fourth current mirror that is connected with the second node and generates a sixth current based on the second current and a current flowing through the second transistor, and a fifth current mirror that generates a seventh current based on the fifth current. The amplifier outputs a difference between the sixth current and the seventh current.

According to an embodiment, an electronic device includes a processor that drives an operating system and applications, a display device that displays a first image and generates a second image under control of the processor, an audio device that outputs a first audio signal and generates a second audio signal under control of the processor, a system memory that is used in an operation of the processor, a storage device that includes a nonvolatile memory storing data under control of the processor, and a power management circuit that supplies a power to at least one of the processor, the display device, the audio device, the system memory, or the storage device. The power management circuit includes an amplifier, and the amplifier includes an input circuit that amplifies a difference between a first input voltage and a second input voltage to generate a first current and a second current, a positive feedback circuit that amplifies a difference between the first current and the second current to generate a third current and a fourth current and to output a difference between the third current and the fourth current through an output node; and a temperature compensation circuit that adjusts an amplification factor of the positive feedback circuit in response to a change of temperature.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that an ordinary one in the art easily implements the present disclosure.

In the following detailed description, various current mirrors may be mentioned. Unless otherwise defined, a mirroring ratio of current mirrors may be 1:1. However, a current mirroring ratio is not limited thereto. For example, the current mirroring ratio may be variously adjusted if necessary.

Figure 1:
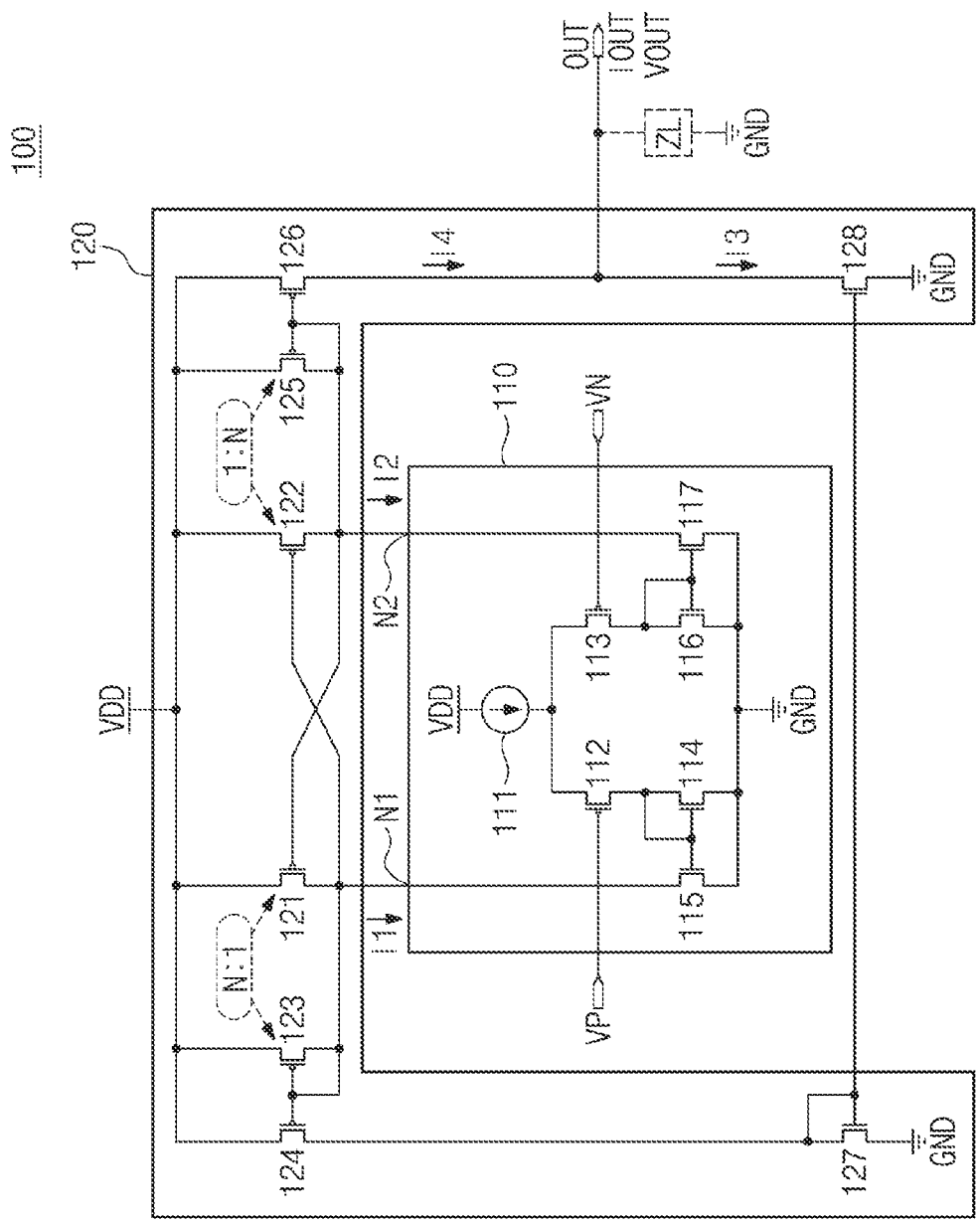
FIG. 1 illustrates an amplifier according to a first embodiment of the present disclosure.

FIG. 1 illustrates an amplifier 100 according to a first embodiment of the present disclosure. Referring to FIG. 1, the amplifier 100 may include an input circuit 110 and a positive feedback circuit 120. The input circuit 110 may receive a first input voltage VP and a second input voltage VN. The input circuit 110 may amplify a difference between the first input voltage VP and the second input voltage VN to generate (e.g., sink) a first current I1 and a second current I2.

The positive feedback circuit 120 may amplify a difference between the first current I1 and the second current I2 to generate a third current I3 and a fourth current I4. The difference between the first current I1 and the second current I2 may be amplified based on a positive feedback. The positive feedback circuit 120 may output a difference between the third current I3 and the fourth current I4 through a first output node OUT as an output current IOUT. It may be understood that, when a load impedance ZL is connected with the first output node OUT, the positive feedback circuit 120 outputs a first output voltage VOUT through the first output node OUT. The first output voltage VOUT may correspond to a product of the output current IOUT and the load impedance ZL.

The input circuit 110 may include a current source 111, a first input transistor 112, a second input transistor 113, a third input transistor 114, a fourth input transistor 115, a fifth input transistor 116, and a sixth input transistor 117. The current source 111 may output a current from a power node to which a power supply voltage VDD is applied.

The first input voltage VP may be applied to a gate of the first input transistor 112. The first input transistor 112 may be a PMOS transistor. The first input transistor 112 may sink a partial current of the current output from the current source 111 in response to the first input voltage VP. As a level of the first input voltage VP increases, the amount of partial current flowing through the first input transistor 112 may decrease. As the level of the first input voltage VP decreases, the amount of partial current flowing through the first input transistor 112 may increase.

The second input voltage VN may be applied to a gate of the second input transistor 113. The second input transistor 113 may be a PMOS transistor. The second input transistor 113 may sink the remaining partial current of the current output from the current source 111 in response to the second input voltage VN. As a level of the second input voltage VN increases, the amount of remaining partial current flowing through the second input transistor 113 may decrease. As the level of the second input voltage VN decreases, the amount of remaining partial current flowing through the second input transistor 113 may increase.

The third input transistor 114 may be connected between the first input transistor 112 and a ground node to which a ground voltage GND is applied. The fourth input transistor 115 may be connected between a first node N1 and the ground node.

The third input transistor 114 and the fourth input transistor 115 may constitute a first input current mirror that generates (e.g., sinks) the first current I1 at the first node N1 based on a current flowing through the first input transistor 112. A ratio of the amount of current flowing through the first input transistor 112 and the amount of first current I1 may correspond to a ratio of a size (e.g., a channel width) of the third input transistor 114 and a size (e.g., a channel width) of the fourth input transistor 115. For example, the amount of current flowing through the first input transistor 112 and the amount of first current I1 may be identical. Each of the third input transistor 114 and the fourth input transistor 115 may be an NMOS transistor.

The fifth input transistor 116 may be connected between the second input transistor 113 and the ground node to which the ground voltage GND is applied. The sixth input transistor 117 may be connected between a second node N2 and the ground node.

The fifth input transistor 116 and the sixth input transistor 117 may constitute a second input current mirror that generates (e.g., sinks) the second current I2 at the second node N2 based on a current flowing through the second input transistor 113. A ratio of the amount of current flowing through the second input transistor 113 and the amount of second current I2 may correspond to a ratio of a size (e.g., a channel width) of the fifth input transistor 116 and a size (e.g., a channel width) of the sixth input transistor 117. For example, the amount of current flowing through the second input transistor 113 and the amount of second current I2 may be identical. Each of the fifth input transistor 116 and the sixth input transistor 117 may be an NMOS transistor.

The positive feedback circuit 120 may include a first feedback transistor 121, a second feedback transistor 122, a third feedback transistor 123, a fourth feedback transistor 124, a fifth feedback transistor 125, a sixth feedback transistor 126, a seventh feedback transistor 127, and an eighth feedback transistor 128.

A gate of the first feedback transistor 121 may be connected with the second node N2. The first feedback transistor 121 may sink a current (e.g., I_121) from the power node to the first node N1 in response to a voltage of the second node N2. The first feedback transistor 121 may be a PMOS transistor.

A gate of the second feedback transistor 122 may be connected with the first node N1. The second feedback transistor 122 may sink a current (e.g., I_122) from the power node to the second node N2 in response to a voltage of the first node N1. The second feedback transistor 122 may be a PMOS transistor.

The third feedback transistor 123 and the fourth feedback transistor 124 may constitute a first feedback current mirror that generates (e.g., outputs) a current (e.g., an intermediate current) based on the first current I1 and the current I_121 flowing through the first feedback transistor 121. For example, the first feedback current mirror may generate an intermediate current corresponding to a current obtained by subtracting the current I_121 flowing through the first feedback transistor 121 from the first current I1. Each of the third feedback transistor 123 and the fourth feedback transistor 124 may be a PMOS transistor.

The fifth feedback transistor 125 and the sixth feedback transistor 126 may constitute a second feedback current mirror that generates (e.g., outputs) the fourth current I4 based on the second current I2 and the current I_122 flowing through the second feedback transistor 122. For example, the second feedback current mirror may generate the fourth current I4 corresponding to a current obtained by subtracting a current I_125 flowing through the fifth feedback transistor 125 from the second current I2. Each of the fifth feedback transistor 125 and the sixth feedback transistor 126 may be a PMOS transistor.

The seventh feedback transistor 127 and the eighth feedback transistor 128 may constitute a third feedback current mirror that generates (e.g., sinks) the third current I3 based on a current output from the first feedback current mirror, that is, a current I_124 flowing through the fourth feedback transistor 124. Each of the seventh feedback transistor 127 and the eighth feedback transistor 128 may be an NMOS transistor.

The sixth feedback transistor 126 (or the second feedback current mirror) may output the fourth current I4 to the first output node OUT, and the eighth feedback transistor 128 (or the third feedback current mirror) may sink the third current I3 from the first output node OUT. The amount of output current IOUT of the first output node OUT and the first output voltage VOUT of the load impedance ZL connected with the first output node OUT may be determined based on the amount of fourth current I4 and the amount of third current I3.

Figure 2:
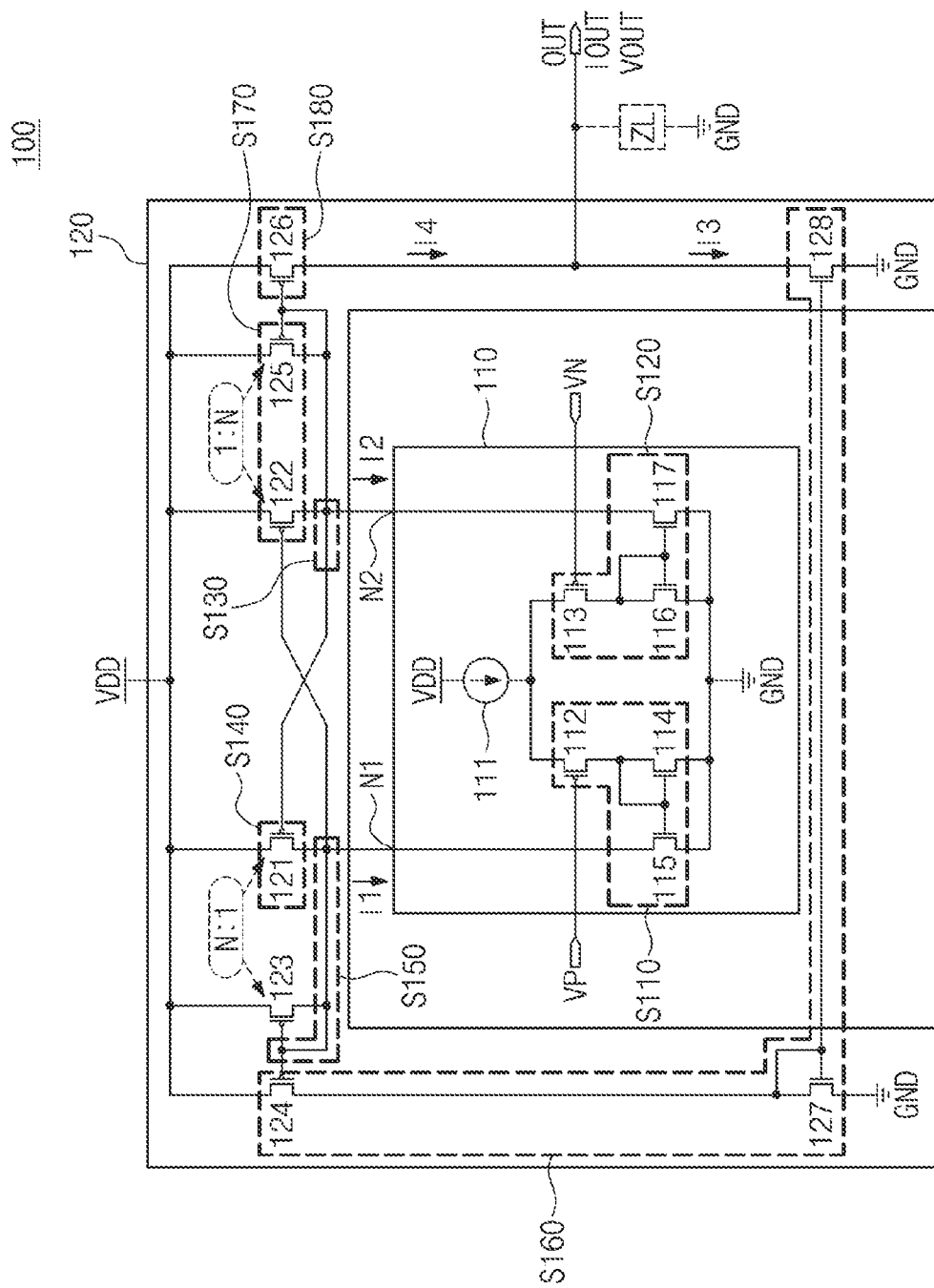
FIG. 2 illustrates an example in which a positive feedback acts at an amplifier of FIG. 1.
Figure 3:
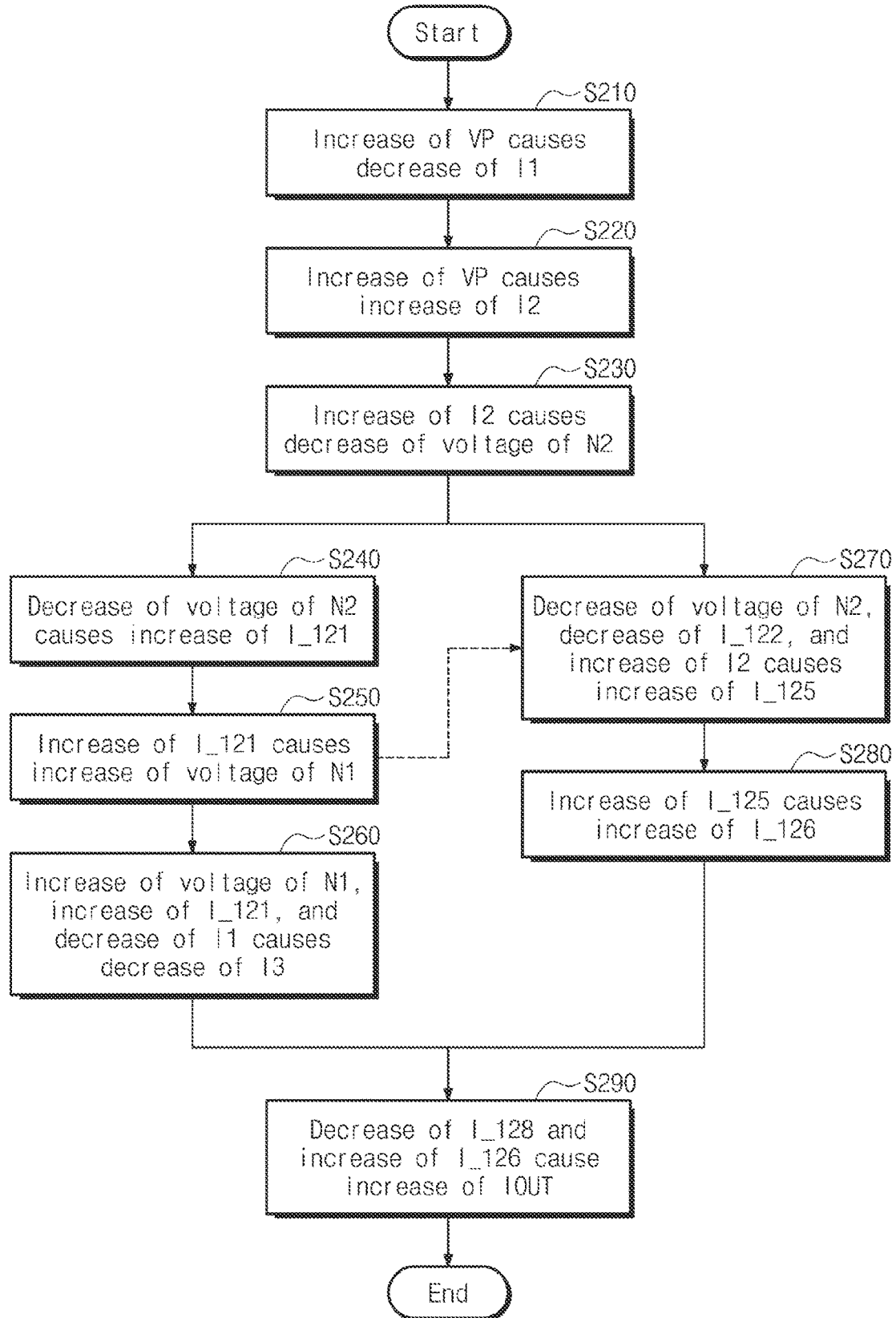
FIG. 3 illustrates a process in which a positive feedback acts at an amplifier of FIG. 1.

FIG. 2 illustrates an example in which a positive feedback acts at the amplifier 100 of FIG. 1. FIG. 3 illustrates a process in which a positive feedback acts at the amplifier 100 of FIG. 1. Referring to FIGS. 2 and 3, in operation S210, an increase of the first input voltage VP may cause a decrease of the first current I1. As marked by operation S110, the increase of the first input voltage VP may cause a decrease of a current flowing through the first input transistor 112. As the current of the first input transistor 112 decreases, the first current I1 that the first input current mirror generates may decrease.

In operation S220, the increase of the first input voltage VP may cause an increase of the second current I2. As marked by operation S110, the increase of the first input voltage VP may cause the decrease of the current flowing through the first input transistor 112. As marked by operation S120, because a current amount of the current source 111 is uniform, the decrease of the current flowing through the first input transistor 112 may cause an increase of a current flowing through the second input transistor 113. As the current of the second input transistor 113 increases, the second current I2 that the second input current mirror generates may increase.

In operation S230, the increase of the second current I2 may cause a decrease of a voltage of the second node N2. As marked by operation S130, because the amount of second current I2 sunk by the second input current mirror increases, a voltage of the second node N2 from which the second current I2 is sunk may decrease.

Below, a positive feedback will be described on the basis of a first path and a second path. The positive feedback of the first path and the positive feedback of the second path may be performed at the same time (or in parallel). The positive feedback of the first path will be first described. In operation S240, the decrease of the voltage of the second node N2 may cause an increase of the current I_121 of the first feedback transistor 121. As marked by operation S140, when the voltage of the second node N2 decreases, a channel of the first feedback transistor 121 may be expanded. Accordingly, the amount of current I_121 flowing through the first feedback transistor 121 may increase.

In operation S250, the increase of the current I_121 flowing through the first feedback transistor 121 may cause an increase of a voltage of the first node N1. As marked by operation S150, as the amount of current I_121 supplied to the first node N1 through the first feedback transistor 121 increases, the voltage of the first node N1 may increase.

In operation S260, the increase of the voltage of the first node N1, the increase of the current I_121 of the first feedback transistor 121, and the decrease of the first current I1 may cause a decrease of the third current I3. As marked by operation S160, when the voltage of the first node N1 increases, the amount of current I_123 flowing through the third feedback transistor 123 may decrease.

Also, a sum of the current I_121 of the first feedback transistor and the current I_123 of the third feedback transistor 123 may be the first current I1, and the current I_121 of the first feedback transistor 121 may increase due to the decrease of the voltage of the second node N2. Accordingly, the current I_123 of the third feedback transistor 123 may further decrease. In addition, the decrease of the first current I1 may further reinforce the decrease of the current I_123 of the third feedback transistor 123.

As the current I_123 of the third feedback transistor 123 decreases, a current that the first feedback current mirror outputs may decrease. As the current that the first feedback current mirror outputs decreases, the amount of third current I3 that the third feedback current mirror sinks may decrease.

Below, the positive feedback of the second path will be described. In operation S270, the decrease of the voltage of the second node N2, the decrease of the current I_122 of the second feedback transistor 122, and the increase of the second current I2 may cause an increase of the current I_125. As marked by operation S170, when the voltage of the second node N2 increases, the amount of current I_125 flowing through the fifth feedback transistor 125 may decrease.

Also, a sum of the current I_122 of the second feedback transistor 122 and the current I_125 of the fifth feedback transistor 125 may be the second current I2, and the current I_122 of the second feedback transistor 122 may decrease due to the increase of the voltage of the first node N1. Accordingly, the current I_125 of the fifth feedback transistor 125 may further increase. In addition, the increase of the second current I2 may further reinforce the increase of the current I_125 of the fifth feedback transistor 125.

As the current I_125 of the fifth feedback transistor 125 increases, in operation S280, a current I_126 of the sixth feedback transistor 126, that is, the fourth current I4 that the second feedback current mirror outputs may increase as marked by operation S170. Because the third current I3 (i.e., the current I_128 of the eighth feedback transistor 128) decreases and the fourth current I4 (i.e., the current I_126 of the sixth feedback transistor 126) increases, in operation S290, the output current IOUT may increase, and the first output voltage VOUT may increase.

For example, the amplifier 100 may be an operational transconductance amplifier. A transconductance of the amplifier 100 may be adjusted by sizes of the first to eighth feedback transistors 121 to 128. In an embodiment, the first and second feedback transistors 121 to 122 may have the same size. The third and fourth feedback transistors 123 to 124 may have the same size. The fifth and sixth feedback transistors 125 to 126 may have the same size. The seventh and eighth feedback transistors 127 to 128 may have the same size.

A ratio of the size of the third feedback transistor 123 and the size of the first feedback transistor 121 may be N:1. A ratio of the size of the fifth feedback transistor 125 and the size of the second feedback transistor 122 may be N:1. Here, "N" may be "2" or may be a number close to "2". A transconductance Gm of the amplifier 100 may be defined by Equation 1 below.

$$Gm = gm \cdot \frac{K2}{1-K1} \quad \text{[Equation 1]}$$

In Equation 1 above, "gm" may be a transconductance of the input circuit 110. "K1" may be a ratio of the size of the first feedback transistor 121 (or the size of the second feedback transistor 122) to the size of the third feedback transistor 123 (or the size of the fifth feedback transistor 125). "K2" may be a ratio of the size of the fourth feedback transistor 124 (or the size of the sixth feedback transistor 126) to the size of the third feedback transistor 123 (or the size of the fifth feedback transistor 125). Equation 1 may be summarized as Equation 2 based on "N".

$$Gm = gm \cdot \frac{1}{1-\frac{1}{N}} \quad \text{[Equation 2]}$$

The transconductance gm of the input circuit 110 may vary depending on temperature. For example, as temperature increases, the transconductance gm of the input circuit 110 may decrease. As temperature decreases, the transconductance gm of the input circuit 110 may increase.

In general, the amplifier 100 is used as a component of a compensation circuit of an electronic device. In the case where the transconductance gm of the input circuit 110 varies depending on temperature, the stability of the compensation circuit and the electronic device may decrease.

Figure 4:
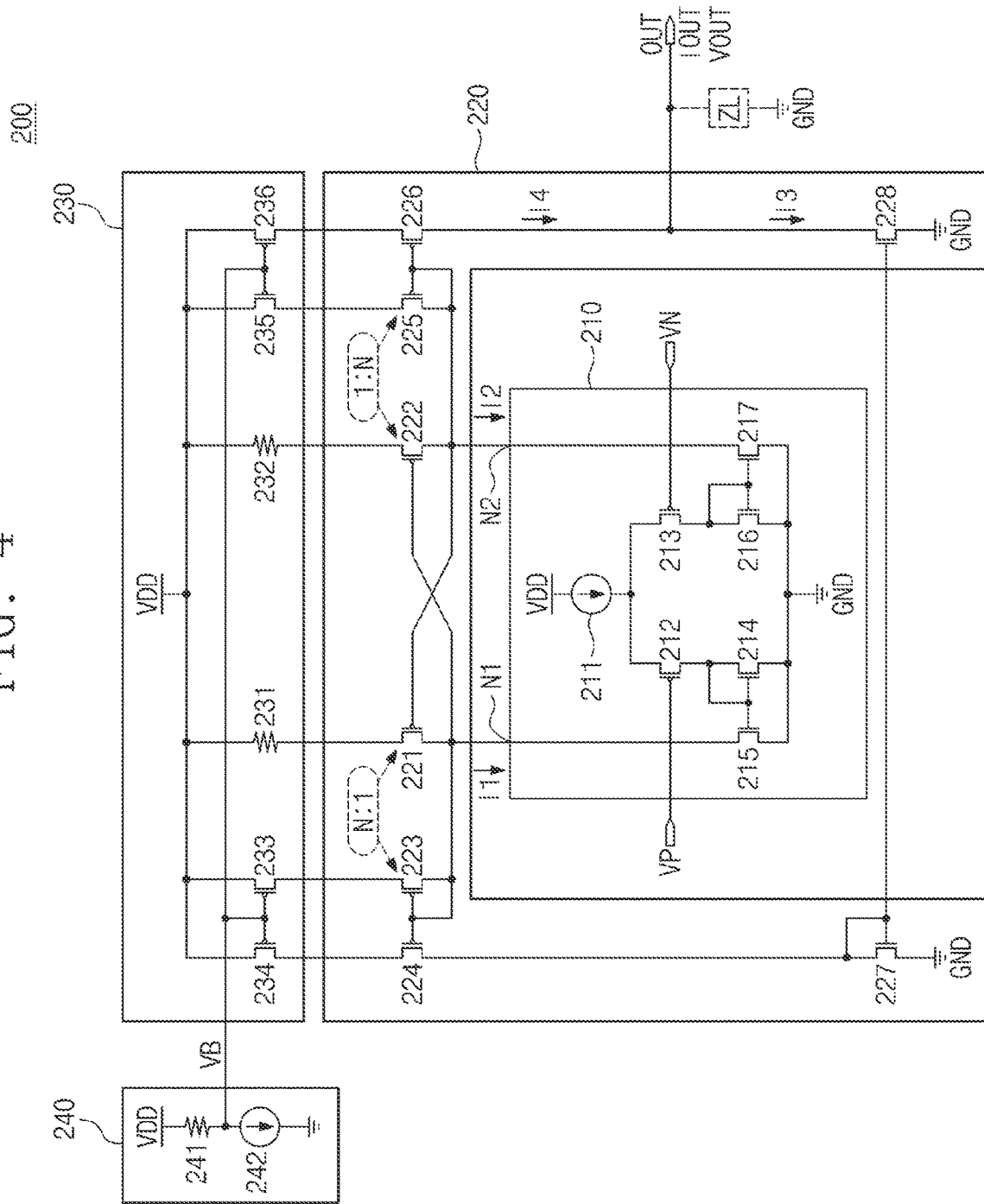
FIG. 4 illustrates an amplifier according to a second embodiment of the present disclosure.

FIG. 4 illustrates an amplifier 200 according to a second embodiment of the present disclosure. Referring to FIG. 4, the amplifier 200 may include an input circuit 210, a positive feedback circuit 220, a temperature compensation circuit 230, and a voltage compensation circuit 240.

The input circuit 210 includes a current source 211 and first to sixth input transistors 212 to 217. The input circuit 210 may receive the first input voltage VP and the second input voltage VN and may generate (e.g., sink) the first current I1 and the second current I2. A configuration and an operation of the input circuit 210 may be substantially the same as those of the input circuit 110 of FIG. 1. Thus, additional description will be omitted to avoid redundancy.

The positive feedback circuit 220 may include first to eighth feedback transistors 221 to 228. The positive feedback circuit 220 may receive voltages from the temperature compensation circuit 230 and may receive the first current I1 and the second current I2 from the input circuit 210 (or may receive the first current I1 and the second current I2 sunk by the input circuit 210). The positive feedback circuit 220 may output the output current IOUT at the first output node OUT or may output the first output voltage VOUT at the load impedance ZL of the first output node OUT.

A configuration and an operation of the positive feedback circuit 220 are the same as those of the positive feedback circuit 120 of FIG. 1 except that the positive feedback circuit 220 receives voltages from the temperature compensation circuit 230 instead of the power supply voltage VDD. Thus, additional description will be omitted to avoid redundancy.

The temperature compensation circuit 230 may receive the power supply voltage VDD, may compensate for a change of temperature to generate voltages, and may transfer the generated voltages to the positive feedback circuit 220. The temperature compensation circuit 230 may operate in response to a bias voltage VB transferred from the voltage compensation circuit 240.

The temperature compensation circuit 230 may include a first temperature compensation resistor 231, a second temperature compensation resistor 232, a first temperature compensation transistor 233, a second temperature compensation transistor 234, a third temperature compensation transistor 235, and a fourth temperature compensation transistor 236.

The first temperature compensation resistor 231 may be connected between the power node and the first feedback transistor 221. The second temperature compensation resistor 232 may be connected between the power node and the second feedback transistor 222. The first temperature compensation resistor 231 and the second temperature compensation resistor 232 may have resistance values that do not change depending on temperature change (or change within a reference value even though temperature changes).

For example, each of the first temperature compensation resistor 231 and the second temperature compensation resistor 232 may be implemented with a combination of a resistor having a positive temperature coefficient and a resistor having a negative temperature coefficient. In an embodiment, n-type doped polysilicon may have a negative temperature coefficient. In contrast, p-type doped polysilicon may have a positive temperature coefficient. Each of the first temperature compensation resistor 231 and the second temperature compensation resistor 232 may be implemented with a combination of n-type doped polysilicon and p-type doped polysilicon.

The first temperature compensation transistor 233 may be connected between the power node and the third feedback transistor 223. The second temperature compensation transistor 234 may be connected between the power node and the fourth feedback transistor 224. The third temperature compensation transistor 235 may be connected between the power node and the fifth feedback transistor 225. The fourth temperature compensation transistor 236 may be connected between the power node and the sixth feedback transistor 226.

The first to fourth temperature compensation transistors 233 to 236 may be biased to a triode state by the bias voltage VB. In the triode state, the first to fourth temperature compensation transistors 233 to 236 may have resistance values that vary depending on temperature.

Figure 5:
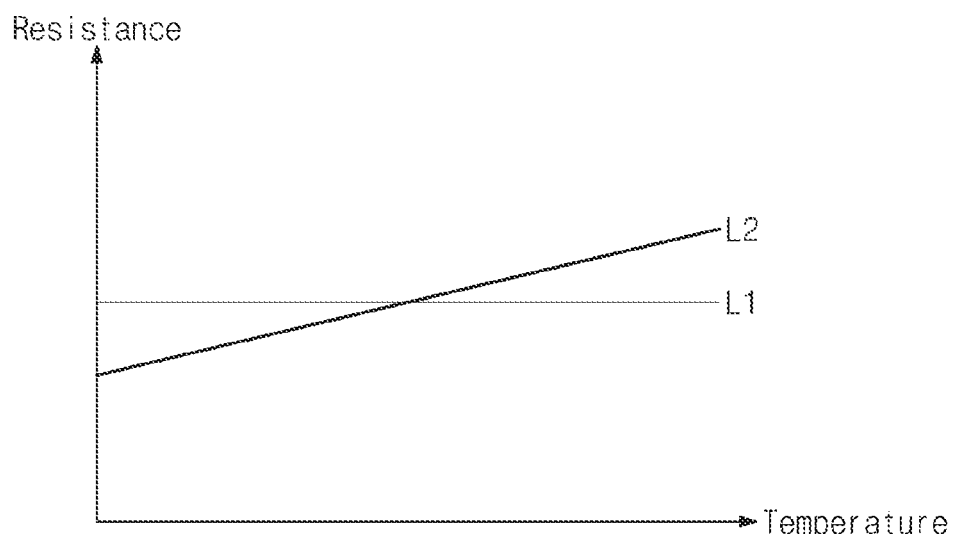
FIG. 5 illustrates an example of resistance values according to temperature.

FIG. 5 illustrates an example of resistance values according to temperature. In FIG. 5, a horizontal axis represents temperature and a vertical axis represents a resistance value. Referring to FIGS. 4 and 5, a first line L1 indicates resistance values of the first temperature compensation resistor 231 and the second temperature compensation resistor 232.

A second line L2 indicates resistance values of the first to fourth temperature compensation transistors 233 to 236.

As temperature changes, the resistance values of the first temperature compensation resistor 231 and the second temperature compensation resistor 232 may not change or may change within a reference value. The resistance values of the first to fourth temperature compensation transistors 233 to 236 may change in proportion to temperature. For example, as temperature increases, the resistance values of the first to fourth temperature compensation transistors 233 to 236 may increase. As temperature decreases, the resistance values of the first to fourth temperature compensation transistors 233 to 236 may decrease.

Because the first to fourth temperature compensation transistors 233 to 236 are biased by the same bias voltage VB, the first to fourth temperature compensation transistors 233 to 236 may have the same resistance value. In an embodiment, a voltage across the first temperature compensation resistor 231 (or a voltage across the second temperature compensation resistor 232) may be the same as a voltage across the first temperature compensation transistor 233 (or a voltage across the third temperature compensation transistor 235). The amount of current I_223 of the third feedback transistor 223 (or the amount of current I_225 of the fifth feedback transistor 225) may be N times the amount of current I_221 of the first feedback transistor 221 (or the amount of current I_222 of the second feedback transistor 222).

In this case, a relationship between a resistance value R_231 of the first temperature compensation resistor 231 (or a resistance value R_232 of the second temperature compensation resistor 232) and a resistance value R_233 of the first temperature compensation transistor 233 (or a resistance value R_235 of the third temperature compensation transistor 235) may be summarized by Equation 3 below.

$$R\_233 = \frac{R\_231}{N} \quad \text{[Equation 3]}$$

Equation 4 below may be obtained by substituting Equation 3 for Equation 2. In Equation 4, "R_231" indicates resistance value of the first temperature compensation resistor 231, and "R_233" indicates a resistance value of the first temperature compensation transistor 233. The resistance value R_232 of the second temperature compensation resistor 232 may be used instead of the resistance value R_231, and the resistance value R_235 of the third temperature compensation transistor 235 may be used instead of the resistance value R_233.

$$Gm = gm \cdot \frac{1}{1 - \frac{R\_233}{R\_231}} \quad \text{[Equation 4]}$$

Partial transconductance Gms, to which the positive feedback circuit 220 and the temperature compensation circuit 230 contribute, of the transconductance Gm of the amplifier 200 may be expressed by Equation 5 below based on Equation 4 above.

$$Gms = \frac{1}{1 - \frac{R\_233}{R\_231}} \quad \text{[Equation 5]}$$

The resistance value R_231 of the first temperature compensation resistor 231 is independent of temperature, and the resistance value R_233 of the first temperature compensation transistor 233 is proportional to temperature. Accordingly, the partial transconductance Gms may be proportional to temperature.

The transconductance gm of the input circuit 210 decreases as temperature increases and increases as temperature decreases. The partial transconductance Gms of the positive feedback circuit 220 and the temperature compensation circuit 230 increases as temperature increases and decreases as temperature decreases. Accordingly, a change of the partial transconductance Gms of the positive feedback circuit 220 and the temperature compensation circuit 230 due to temperature change may compensate for a change of the transconductance gm of the input circuit 210 due to temperature change.

The voltage compensation circuit 240 may compensate for a change of the power supply voltage VDD to generate the bias voltage VB. For example, even though the power supply voltage VDD changes, the voltage compensation circuit 240 may uniformly maintain a difference between the bias voltage VB and the power supply voltage VDD.

The voltage compensation circuit 240 may include a voltage compensation resistor 241 and a current source 242. As the current source 242 sinks a given amount of current, a voltage that is dropped by the voltage compensation resistor 241 from the power supply voltage VDD may be output as the bias voltage VB.

In an embodiment, the voltage compensation resistor 241 may have a resistance value that does not change or changes within a reference value when temperature changes. Accordingly, even though the power supply voltage VDD changes, a difference between the bias voltage VB and the power supply voltage VDD may be uniformly maintained. In the case where the difference between the bias voltage VB and the power supply voltage VDD is uniformly maintained, even though the power supply voltage VDD changes, the resistance values of the first to fourth temperature compensation transistors 233 to 236 may be uniformly maintained.

Figure 6:
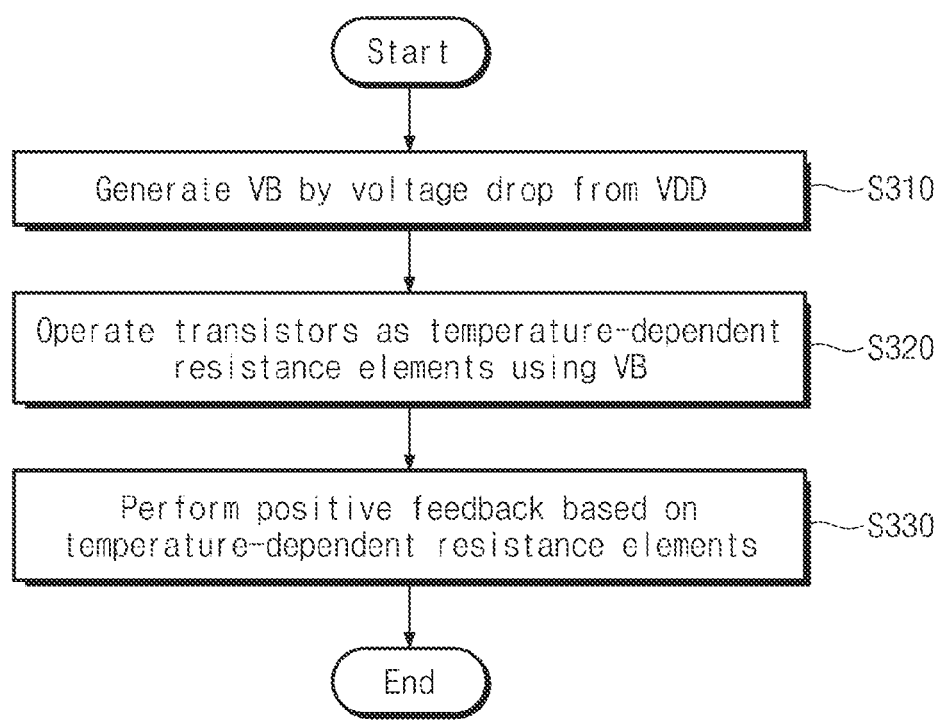
FIG. 6 illustrates an example of an operating method of an amplifier.

FIG. 6 illustrates an example of an operating method of the amplifier 200. Referring to FIGS. 4 and 6, in operation S310, the voltage compensation circuit 240 of the amplifier 200 may drop the power supply voltage VDD to generate the bias voltage VB. Even though the power supply voltage VDD changes, a difference between the bias voltage VB and the power supply voltage VDD may be maintained.

In operation S320, the temperature compensation circuit 230 may operate transistors as temperature-dependent resistance elements by using the bias voltage VB. As temperature increases, the resistance values of the first to fourth temperature compensation transistors 233 to 236 may increase. As temperature decreases, the resistance values of the first to fourth temperature compensation transistors 233 to 236 may decrease.

In operation S330, the input circuit 210 and the positive feedback circuit 220 of the amplifier 200 may perform a positive feedback based on the temperature-dependent resistance elements. A characteristic in which the transconductance gm of the input circuit 210 changes depending on temperature may be compensated for by the positive feedback.

As described above, the amplifier 200 according to an embodiment of the present disclosure may compensate for a change of temperature and a change of the power supply voltage VDD. Accordingly, the stability of the amplifier 200 may be improved, and the stability of an electronic device and a system each including the amplifier 200 may be improved.

Names of components according to the technical idea of the present disclosure are not limited. In an embodiment, the input circuit 210 and the positive feedback circuit 220 may be referred to as an "amplifier". Also, the temperature compensation circuit 230 and the voltage compensation circuit 240 may be referred to as a "compensation circuit" that compensates for temperature and voltage dependent characteristics of the amplifier.

Figure 7:
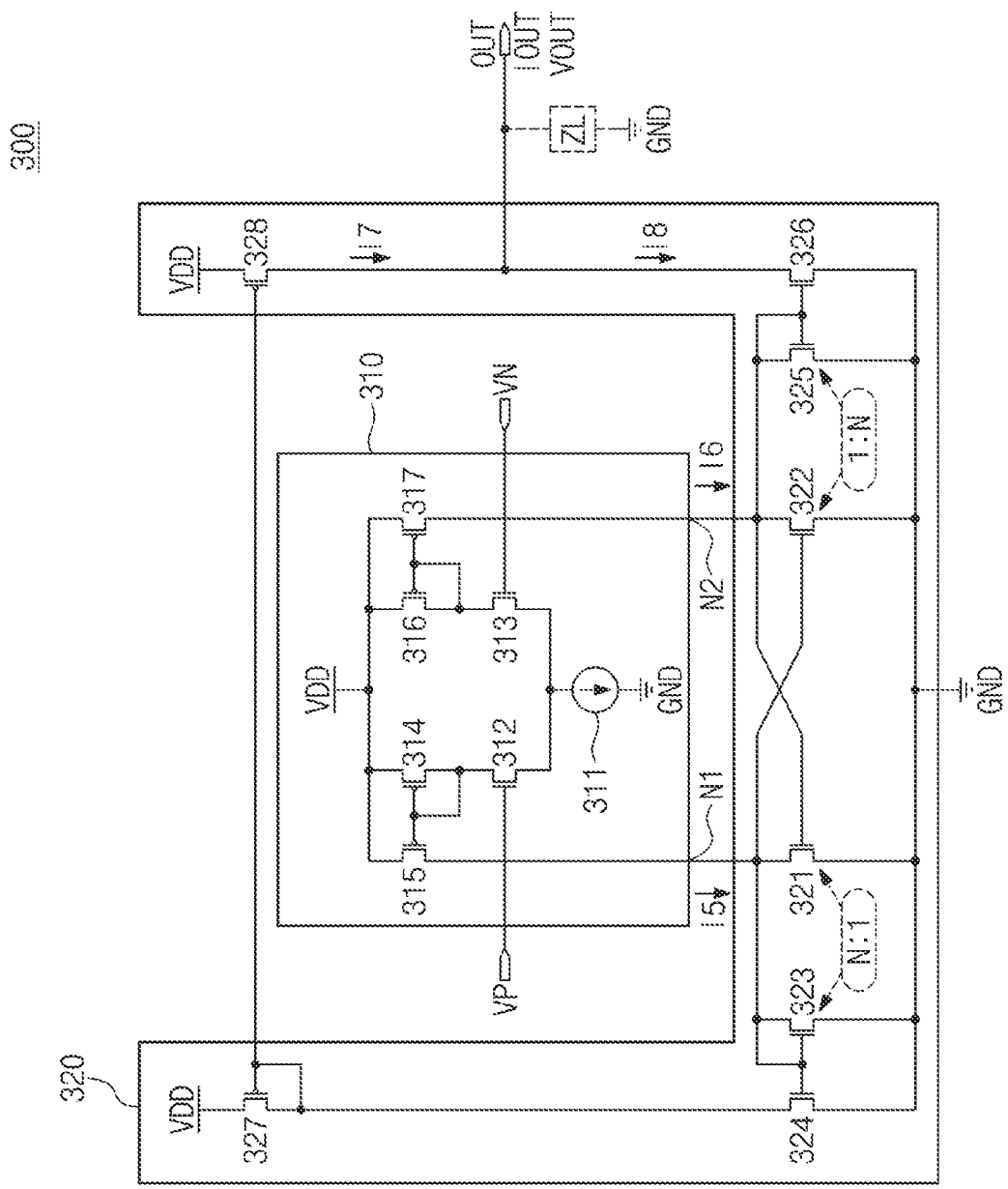
FIG. 7 illustrates an amplifier according to a third embodiment of the present disclosure.

FIG. 7 illustrates an amplifier 300 according to a third embodiment of the present disclosure. Referring to FIG. 7, the amplifier 300 may include an input circuit 310 and a positive feedback circuit 320. The input circuit 310 may receive the first input voltage VP and the second input voltage VN. The input circuit 310 may amplify a difference between the first input voltage VP and the second input voltage VN to generate (e.g., output) a fifth current I5 and a sixth current I6.

The positive feedback circuit 320 may amplify a difference between the fifth current I5 and the sixth current I6 to generate a seventh current I7 and an eighth current I8. The difference between the fifth current I5 and the sixth current I6 may be amplified based on a positive feedback. The positive feedback circuit 320 may output a difference between the seventh current I7 and the eighth current I8 through the first output node OUT as the output current IOUT. It may be understood that, when the load impedance ZL is connected with the first output node OUT, the positive feedback circuit 320 outputs the first output voltage VOUT through the first output node OUT. The first output voltage VOUT may correspond to a product of the output current IOUT and the load impedance ZL.

The input circuit 310 may include a current source 311, a first input transistor 312, a second input transistor 313, a third input transistor 314, a fourth input transistor 315, a fifth input transistor 316, and a sixth input transistor 317. The current source 311 may sink a current to the ground node to which the ground voltage GND is applied.

The first input voltage VP may be applied to a gate of the first input transistor 312. The first input transistor 312 may be an NMOS transistor. A partial current of the current flowing through the current source 311 may flow through the first input transistor 312 operating in response to the first input voltage VP. As a level of the first input voltage VP increases, the amount of partial current flowing through the first input transistor 312 may increase. As the level of the first input voltage VP decreases, the amount of partial current flowing through the first input transistor 312 may decrease.

The second input voltage VN may be applied to a gate of the second input transistor 313. The second input transistor 313 may be an NMOS transistor. The remaining partial current of the current sunk through the current source 311 may flow through the second input transistor 313 operating in response to the second input voltage VN. As a level of the second input voltage VN increases, the amount of remaining partial current flowing through the second input transistor 313 may increase. As the level of the second input voltage VN decreases, the amount of remaining partial current flowing through the second input transistor 313 may decrease.

The third input transistor 314 may be connected between the power node to which the power supply voltage VDD is applied and the first input transistor 312. The fourth input transistor 315 may be connected between the power node and a first node N1.

The third input transistor 314 and the fourth input transistor 315 may constitute a first input current mirror that generates (e.g., outputs) the fifth current I5 at the first node N1 based on a current flowing through the first input transistor 312. A ratio of the amount of current flowing through the first input transistor 312 and the amount of fifth current I5 may correspond to a ratio of a size (e.g., a channel width) of the third input transistor 314 and a size (e.g., a channel width) of the fourth input transistor 315. For example, the amount of current flowing through the first input transistor 312 and the amount of fifth current I5 may be identical. Each of the third input transistor 314 and the fourth input transistor 315 may be a PMOS transistor.

The fifth input transistor 316 may be connected between the power node to which the power supply voltage VDD is applied and the second input transistor 313. The sixth input transistor 317 may be connected between the power node and a second node N2.

The fifth input transistor 316 and the sixth input transistor 317 may constitute a second input current mirror that generates (e.g., outputs) the sixth current I6 at the second node N2 based on a current flowing through the second input transistor 313. A ratio of the amount of current flowing through the second input transistor 313 and the amount of sixth current I6 may correspond to a ratio of a size (e.g., a channel width) of the fifth input transistor 316 and a size (e.g., a channel width) of the sixth input transistor 317. For example, the amount of current flowing through the second input transistor 313 and the amount of sixth current I6 may be identical. Each of the fifth input transistor 316 and the sixth input transistor 317 may be a PMOS transistor.

The positive feedback circuit 320 may include a first feedback transistor 321, a second feedback transistor 322, a third feedback transistor 323, a fourth feedback transistor 324, a fifth feedback transistor 325, a sixth feedback transistor 326, a seventh feedback transistor 327, and an eighth feedback transistor 328.

A gate of the first feedback transistor 321 may be connected with the second node N2. The first feedback transistor 321 may sink a current (e.g., I_321) from the first node N1 to the ground node in response to a voltage of the second node N2. The first feedback transistor 321 may be an NMOS transistor.

A gate of the second feedback transistor 322 may be connected with the first node N1. The second feedback transistor 322 may sink a current (e.g., I_322) from the second node N2 to the ground node in response to a voltage of the first node N1. The second feedback transistor 322 may be an NMOS transistor.

The third feedback transistor 323 and the fourth feedback transistor 324 may constitute a fourth feedback current mirror that generates (e.g., outputs) a current (e.g., an intermediate current) based on the fifth current I5 and the current I_321 flowing through the first feedback transistor 321. For example, the fourth feedback current mirror may generate an intermediate current corresponding to a current obtained by subtracting the current I_321 flowing through the first feedback transistor 321 from the fifth current I5. Each of the third feedback transistor 323 and the fourth feedback transistor 324 may be an NMOS transistor.

The fifth feedback transistor 325 and the sixth feedback transistor 326 may constitute a fifth feedback current mirror that generates (e.g., outputs) the eighth current I8 based on the sixth current I6 and the current I_322 flowing through the second feedback transistor 322. For example, the fifth feedback current mirror may generate the eighth current I8 corresponding to a current obtained by subtracting a current I_325 flowing through the fifth feedback transistor 325 from the sixth current I6. Each of the fifth feedback transistor 325 and the sixth feedback transistor 326 may be an NMOS transistor.

The seventh feedback transistor 327 and the eighth feedback transistor 328 may constitute a sixth feedback current mirror that generates (e.g., outputs) the seventh current I7 based on a current output from the first feedback current mirror, that is, a current I_324 flowing through the fourth feedback transistor 324. Each of the seventh feedback transistor 327 and the eighth feedback transistor 328 may be a PMOS transistor.

The sixth feedback transistor 326 (or the fifth feedback current mirror) may sink the eighth current I8 from the first output node OUT, and the eighth feedback transistor 328 (or the sixth feedback current mirror) may output the seventh current I7 to the first output node OUT. The amount of output current IOUT of the first output node OUT or the first output voltage VOUT of the load impedance ZL connected with the first output node OUT may be determined based on the amount of eighth current I8 and the amount of seventh current I7.

An operation and a configuration of the amplifier 300 of FIG. 7 may be the same as those of the amplifier 100 of FIG. 1 except that PMOS transistors are changed to NMOS transistors, NMOS transistors are changed to PMOS transistors, a power node is changed to a ground node, and a ground node is changed to a power node. Thus, additional description associated with the amplifier 300 of FIG. 7 will be omitted to avoid redundancy.

Figure 8:
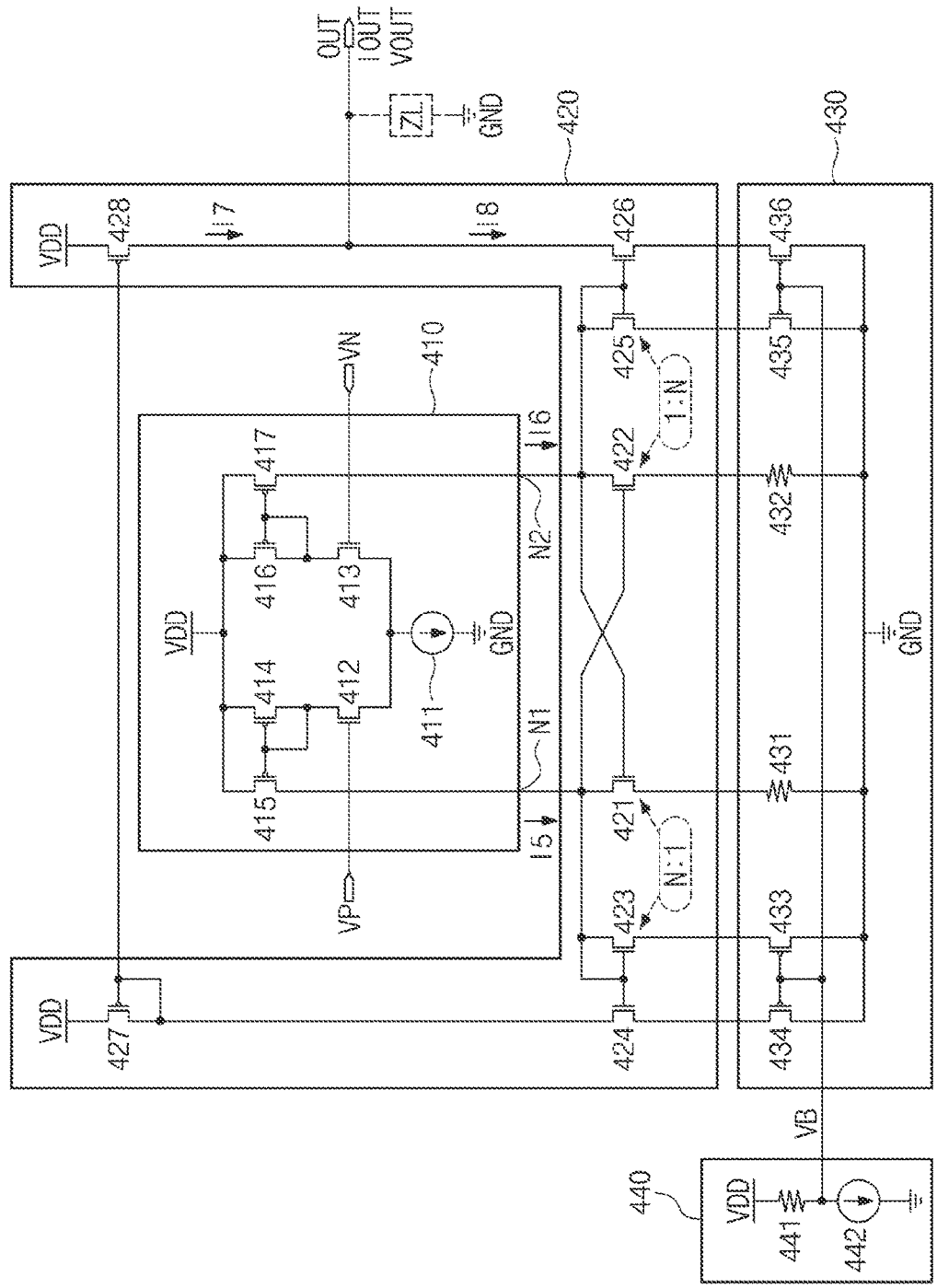
FIG. 8 illustrates an amplifier according to a fourth embodiment of the present disclosure.

FIG. 8 illustrates an amplifier 400 according to a fourth embodiment of the present disclosure. Referring to FIG. 8, the amplifier 400 may include an input circuit 410, a positive feedback circuit 420, a temperature compensation circuit 430, and a voltage compensation circuit 440.

The input circuit 410 includes a current source 411 and first to sixth input transistors 412 to 417. The input circuit 410 may receive the first input voltage VP and the second input voltage VN and may generate (e.g., sink) the fifth current I5 and the sixth current I6. A configuration and an operation of the input circuit 410 may be the same as those of the input circuit 310 of FIG. 7. Thus, additional description will be omitted to avoid redundancy.

The positive feedback circuit 420 may include first to eighth feedback transistors 421 to 428. The positive feedback circuit 420 may receive voltages from the temperature compensation circuit 430 and may receive the fifth current I5 and the sixth current I6 from the input circuit 410. The positive feedback circuit 420 may output the output current IOUT at the first output node OUT or may output the first output voltage VOUT at the load impedance ZL of the first output node OUT.

A configuration and an operation of the positive feedback circuit 420 are the same as those of the positive feedback circuit 320 of FIG. 7 except that the positive feedback circuit 420 receives voltages from the temperature compensation circuit 430 instead of the power supply voltage VDD. Thus, additional description will be omitted to avoid redundancy.

The temperature compensation circuit 430 may receive the ground voltage GND, may compensate for a change of temperature to generate voltages, and may transfer the generated voltages to the positive feedback circuit 420. The temperature compensation circuit 430 may operate in response to a bias voltage VB transferred from the voltage compensation circuit 440.

The temperature compensation circuit 430 may include a first temperature compensation resistor 431, a second temperature compensation resistor 432, a first temperature compensation transistor 433, a second temperature compensation transistor 434, a third temperature compensation transistor 435, and a fourth temperature compensation transistor 436.

The first temperature compensation resistor 431 may be connected between the first feedback transistor 421 and the ground node. The second temperature compensation resistor 432 may be connected between the second feedback transistor 422 and the ground node. The first temperature compensation resistor 431 and the second temperature compensation resistor 432 may have resistance values that do not change depending on temperature change (or change within a reference value even though temperature changes).

For example, each of the first temperature compensation resistor 431 and the second temperature compensation resistor 432 may be implemented with a combination of a resistor having a positive temperature coefficient and a resistor having a negative temperature coefficient. In an embodiment, n-type doped polysilicon may have a negative temperature coefficient. In contrast, p-type doped polysilicon may have a positive temperature coefficient. Each of the first temperature compensation resistor 431 and the second temperature compensation resistor 432 may be implemented with a combination of n-type doped polysilicon and p-type doped polysilicon.

The first temperature compensation transistor 433 may be connected between the third feedback transistor 423 and the ground node. The second temperature compensation transistor 434 may be connected between the fourth feedback transistor 424 and the ground node. The third temperature compensation transistor 435 may be connected between the fifth feedback transistor 425 and the ground node. The fourth temperature compensation transistor 436 may be connected between the sixth feedback transistor 426 and the ground node.

The first to fourth temperature compensation transistors 433 to 436 may be biased to a triode state by the bias voltage VB. In the triode state, the first to fourth temperature compensation transistors 433 to 436 may have resistance values that vary depending on temperature. For example, as temperature increases, the resistance values of the first to fourth temperature compensation transistors 433 to 436 may increase. As temperature decreases, the resistance values of the first to fourth temperature compensation transistors 433 to 436 may decrease. Because the first to fourth temperature compensation transistors 433 to 436 are biased by the same bias voltage VB, the first to fourth temperature compensation transistors 233 to 236 may have the same resistance value.

As described with reference to Equation 3 to Equation 5, the transconductance gm of the input circuit 410 decreases as temperature increases and increases as temperature decreases. The partial transconductance Gms of the positive feedback circuit 420 and the temperature compensation circuit 430 increases as temperature increases and decreases as temperature decreases. Accordingly, a change of the partial transconductance Gms of the positive feedback circuit 420 and the temperature compensation circuit 430 due to temperature change may compensate for a change of the transconductance gm of the input circuit 410 due to temperature change.

The voltage compensation circuit 440 may compensate for a change of the power supply voltage VDD to generate the bias voltage VB. For example, even though the power supply voltage VDD changes, the voltage compensation circuit 440 may uniformly maintain a difference between the bias voltage VB and the ground voltage GND.

The voltage compensation circuit 440 may include a voltage compensation resistor 441 and a current source 442. As the current source 442 sinks a given amount of current, a voltage that is increased by the voltage compensation resistor 441 from the ground voltage GND may be output as the bias voltage VB.

In an embodiment, the voltage compensation resistor 441 may have a resistance value that does not change or changes within a reference value when temperature changes. Accordingly, even though the power supply voltage VDD changes, a difference between the bias voltage VB and the ground voltage GND may be uniformly maintained. In the case where the difference between the bias voltage VB and the ground voltage GND is uniformly maintained, even though the power supply voltage VDD changes, the resistance values of the first to fourth temperature compensation transistors 433 to 436 may be uniformly maintained.

Figure 9:
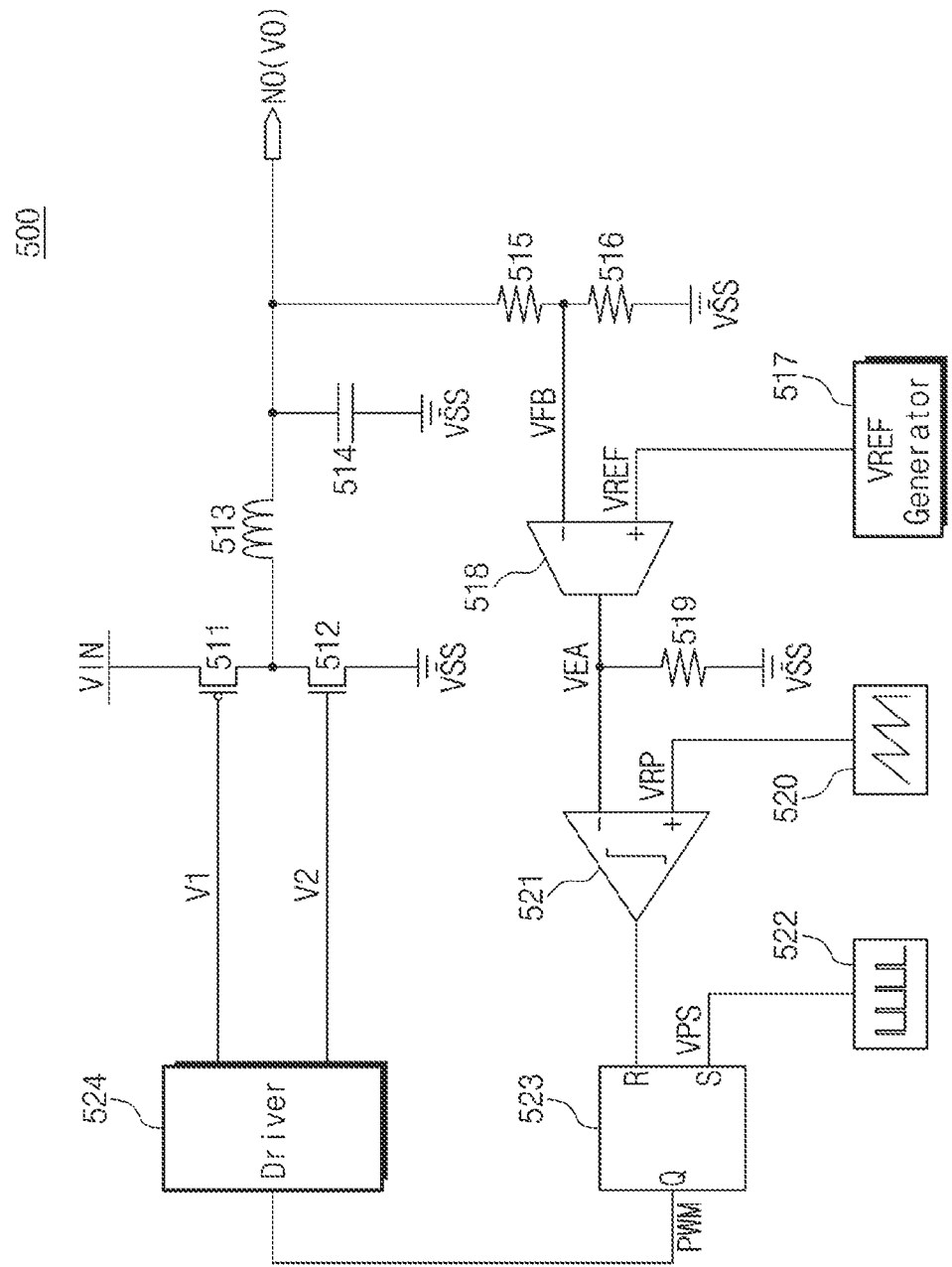
FIG. 9 illustrates an example of an electronic device including an amplifier according to an embodiment of the present disclosure.

FIG. 9 illustrates an example of an electronic device 500 including the amplifier 100, 200, 300, or 400 according to an embodiment of the present disclosure. Referring to FIG. 9, the electronic device 500 may be a buck converter. The electronic device 500 may step down an input voltage VIN and may output the stepped-down voltage as a second output voltage VO to a second output node NO.

The electronic device 500 may include a first driving transistor 511, a second driving transistor 512, a first charging element 513, a second charging element 514, a first dividing resistor 515, a second dividing resistor 516, a reference voltage generator 517, an amplifier 518, a load resistor 519, a ramp voltage generator 520, a comparator 521, a pulse voltage generator 522, a flip-flop 523, and a driver 524.

The first driving transistor 511 may be turned on or turned off in response to a first voltage V1. When turned on, the first driving transistor 511 may transfer the input voltage VIN to the first charging element 513. The first driving transistor 511 may be, but is not limited to, a PMOS transistor.

The second driving transistor 512 may be turned on or turned off in response to a second voltage V2. When turned on, the second driving transistor 512 may sink a current from the first charging element 513 to the ground node to which a ground voltage GND is applied. The second driving transistor 512 may be, but is not limited to, an NMOS transistor.

The first charging element 513 may be an inductor. The second charging element 514 may be a capacitor. In a first phase, the first driving transistor 511 may be turned on, and the second driving transistor 512 may be turned off. The input voltage VIN may be charged to the first charging element 513 and the second charging element 514. In a second phase, the first driving transistor 511 may be turned off, and the second driving transistor 512 may be turned on. Charges charged in the first charging element 513 and the second charging element 514 may be supplied to the second output node NO based on the ground voltage VSS.

As the first phase and the second phase are alternate, the second output voltage VO of the second output node NO may be lower than the input voltage VIN. A level of the second output voltage VO may be adjusted by adjusting a time length of the first phase and a time length of the second phase.

The first dividing resistor 515 and the second dividing resistor 516 may be connected between the second output node NO and the ground node. The first dividing resistor 515 and the second dividing resistor 516 may divide the second output voltage VO to output a feedback voltage VFB.

The reference voltage generator 517 may generate a reference voltage VREF. The amplifier 518 may compare the feedback voltage VFB and the reference voltage VREF. The amplifier 518 may include the amplifier 100, 200, 300, or 400 described with reference to FIGS. 1 to 8. An output of the amplifier 518 may be connected with the load resistor 519. The load resistor 519 may correspond to the load impedance ZL described with reference to FIGS. 1 to 8.

The amplifier 518 may output an error voltage VEA to an output node to which the load resistor 519 is connected. In an embodiment, the first dividing resistor 515, the second dividing resistor 516, the reference voltage generator 517, and the amplifier 518 may be configured to compare whether the second output voltage VO reaches a target voltage. The target voltage may be a target value of the second output voltage VO of the electronic device 500.

When the second output voltage VO is greater than the target voltage, the amplifier 518 may be configured to output a negative error voltage VEA. When the second output voltage VO is equal to or smaller than the target voltage, the amplifier 518 may be configured to output a positive error voltage VEA. The amplifier 518 may be regarded as an error amplifier. As a difference between the second output voltage VO and the target voltage increases, an absolute level of a voltage that the amplifier 518 outputs may increase.

The ramp voltage generator 520 may generate a ramp voltage VRP. A period of the ramp voltage may correspond to a sum of time lengths of the first and second phases associated with the first driving transistor 511 and the second driving transistor 512, that is, may correspond to an operating period of the electronic device 500.

The comparator 521 may compare the ramp voltage VRP and the error voltage VEA. When the ramp voltage VRP is greater than the error voltage VEA, the comparator 521 may output a signal of a first logical level. When the ramp voltage VRP is equal to or smaller than the error voltage VEA, the comparator 521 may output a signal of a second logical level. As the ramp voltage VRP gradually increases during one operating period, an initial output of the comparator 521 may be at the second logical level. When the ramp voltage VRP is greater than the error voltage VEA, the output of the comparator 521 may transition from the second logical level to the first logical level.

The pulse voltage generator 522 may output a pulse voltage VPS that transitions from the low level to the high level and then transitions from the high level to the low level, at the beginning of the operating period. The pulse voltage VPS may toggle periodically based on the operating period.

The flip-flop 523 may include a set input "S" of receiving the pulse voltage VPS, and a reset input "R" of receiving the output of the comparator 521. An output of the flip-flop 523 may be output to the driver 524 as a pulse width modulation signal PWM.

At the beginning of the operating period, the pulse width modulation signal PWM may be set to the high level by the pulse voltage VPS. When the ramp voltage VRP is greater than the error voltage VEA, the output of the comparator 521 may transition from the second logical level to the first logical level. In response to the first logical level of the output of the comparator 521, the flip-flop 523 may reset the pulse width modulation signal PWM to the low level.

That is, when the second output voltage VO is smaller than the target voltage, the error voltage VEA output from the amplifier 518 may increase. In the operating period, a time at which the output of the comparator 521 transitions from the second logical level to the first logical level may be delayed as the error voltage VEA output from the amplifier 518 increases. In the operating period, a time at which the pulse width modulation signal PWM is reset to the low level may be delayed as the time at which the output of the comparator 521 transitions from the second logical level to the first logical level is delayed.

The pulse width modulation signal PWM may have the high level and the low level during the operating period. At the beginning of the operating period, the pulse width modulation signal PWM may be set to the high level by the pulse voltage VPS. When the ramp voltage VRP is greater than the error voltage VEA, the pulse width modulation signal PWM may be reset to the low level by the output of the comparator 521. In the operating period, a ratio of duration where the pulse width modulation signal PWM is at the high level may be a duty ratio.

As the second output voltage VO decreases to less than the target voltage, the duty ratio of the pulse width modulation signal PWM may increase. That is, the duty ratio of the pulse width modulation signal PWM may include information indicating how much the second output voltage VO is smaller than the target voltage. The driver 524 may turn on the first driving transistor 511 through the first voltage V1 during the high level of the pulse width modulation signal PWM. The driver 524 may turn on the second driving transistor 512 through the second voltage V2 during the low level of the pulse width modulation signal PWM.

In an embodiment, to prevent a large amount of current from flowing when the first driving transistor 511 and the second driving transistor 512 are together turned on, the driver 524 may insert a dead time during which both the first driving transistor 511 and the second driving transistor 512 are turned off when the pulse width modulation signal PWM transitions.

Figure 10:
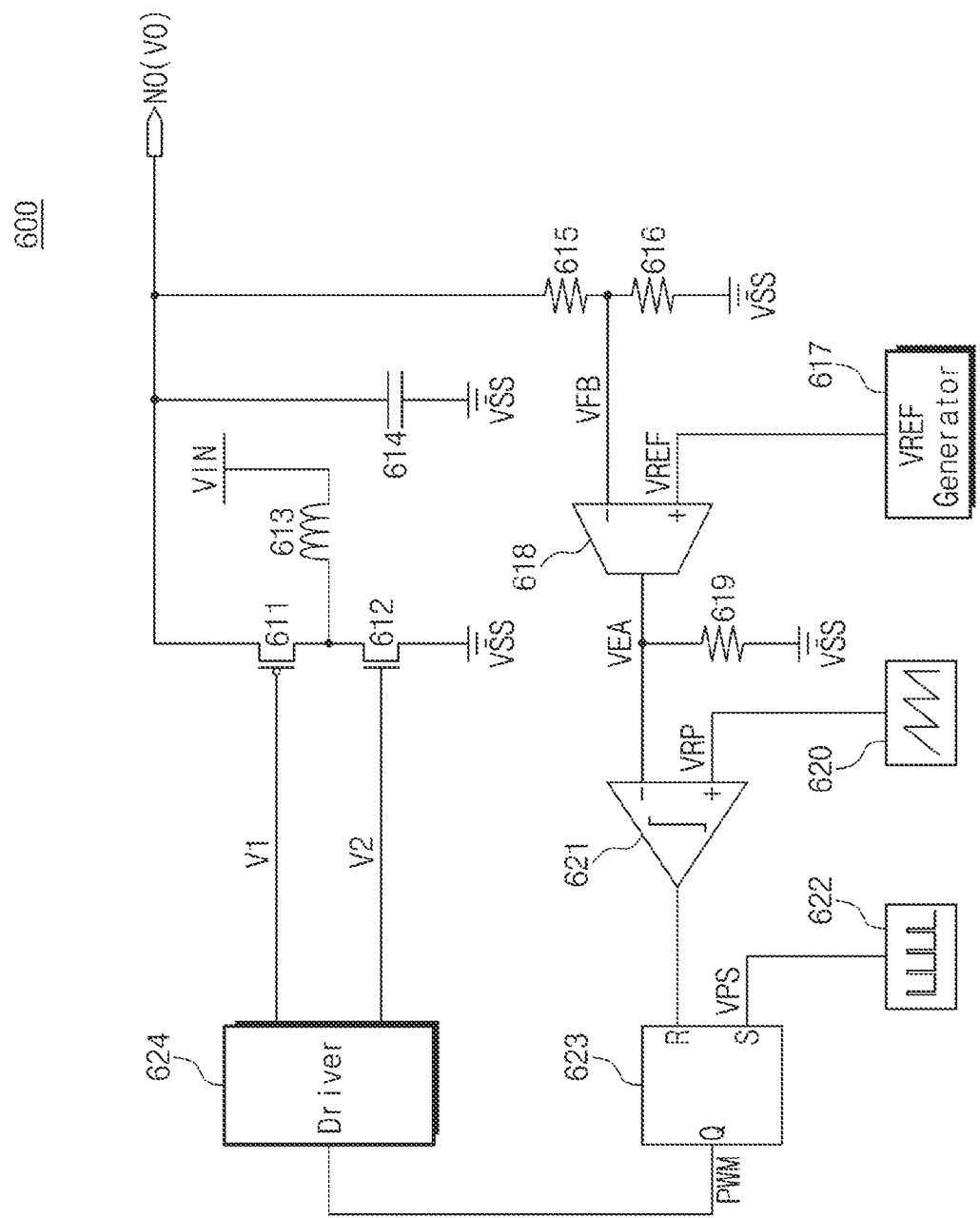
FIG. 10 illustrates another example of an electronic device including an amplifier according to an embodiment of the present disclosure.

FIG. 10 illustrates another example of an electronic device 600 including the amplifier 100, 200, 300, or 400 according to an embodiment of the present disclosure. Referring to FIG. 10, the electronic device 600 may be a boost converter. The electronic device 600 may step up the input voltage VIN and may output the stepped-up voltage as the second output voltage VO to the second output node NO.

The electronic device 600 may include a first driving transistor 611, a second driving transistor 612, a first charging element 613, a second charging element 614, a first dividing resistor 615, a second dividing resistor 616, a reference voltage generator 617, an amplifier 618, a load resistor 619, a ramp voltage generator 620, a comparator 621, a pulse voltage generator 622, a flip-flop 623, and a driver 624.

The first driving transistor 611 may be turned on or turned off in response to the first voltage V1. The first driving transistor 611 may be, but is not limited to, a PMOS transistor. The second driving transistor 612 may be turned on or turned off in response to the second voltage V2. The second driving transistor 612 may be, but is not limited to, an NMOS transistor.

The first charging element 613 may be an inductor. The second charging element 614 may be a capacitor. In the second phase, the first driving transistor 611 may be turned off, and the second driving transistor 612 may be turned on. The input voltage VIN may be charged to the first charging element 613. In the first phase, the first driving transistor 611 may be turned on, and the second driving transistor 612 may be turned off. A voltage corresponding to a sum of the input voltage VIN and a voltage charged in the first charging element 613 may be output to the second output node NO as the second output voltage VO. As the first phase and the second phase are alternate, the second output voltage VO of the second output node NO may be greater than the input voltage VIN. A level of the second output voltage VO may be adjusted by adjusting a time length of the first phase and a time length of the second phase.

Operations and configurations of the first dividing resistor 615, the second dividing resistor 616, the reference voltage generator 617, the amplifier 618, the load resistor 619, the ramp voltage generator 620, the comparator 621, the pulse voltage generator 622, the flip-flop 623, and the driver 624 are the same as those of the first dividing resistor 515, the second dividing resistor 516, the reference voltage generator 517, the amplifier 518, the load resistor 519, the ramp voltage generator 520, the comparator 521, the pulse voltage generator 522, the flip-flop 523, and the driver 524, which are described with reference to FIG. 9. Thus, additional description will be omitted to avoid redundancy.

Figure 11:
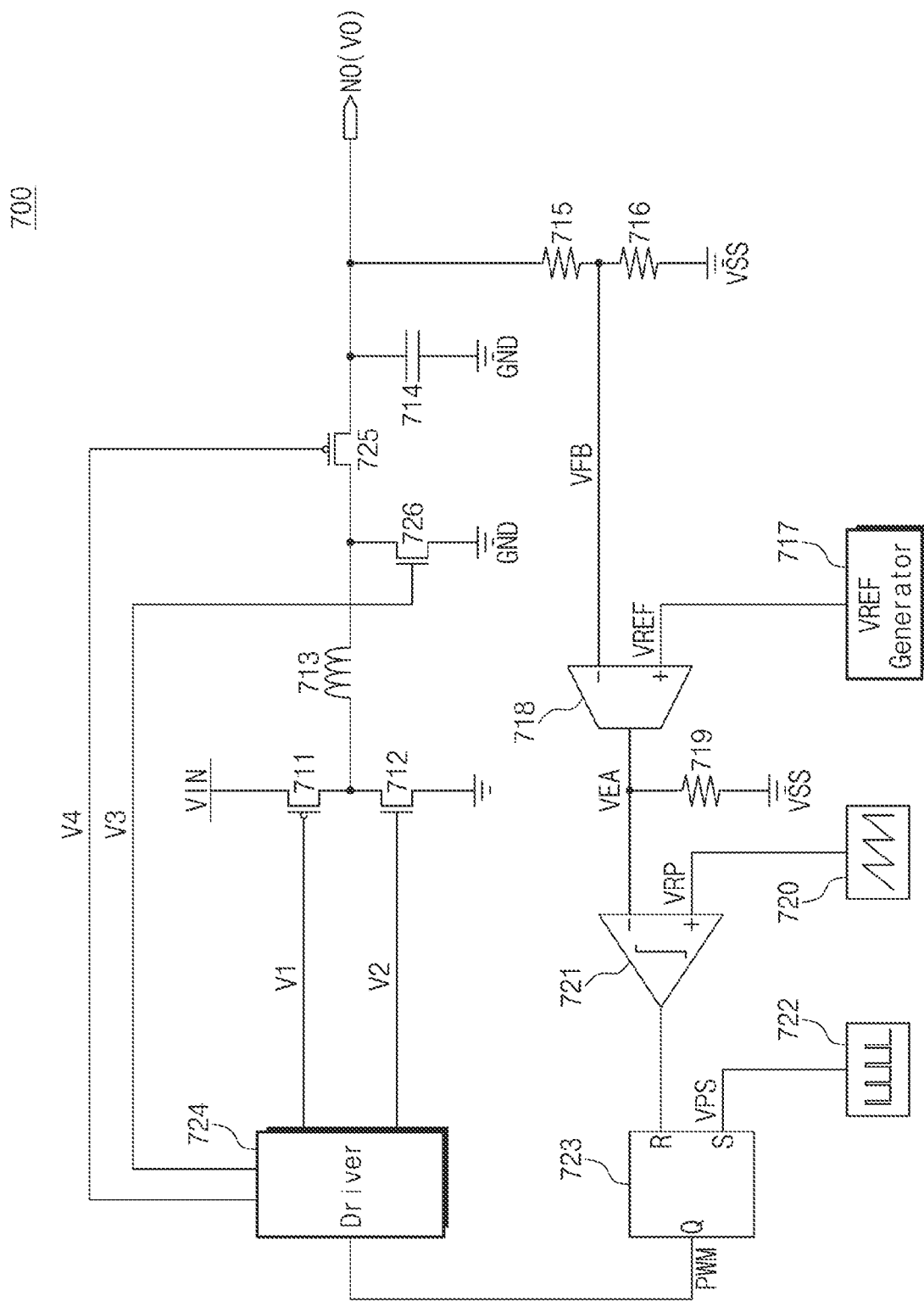
FIG. 11 illustrates another example of an electronic device including an amplifier according to an embodiment of the present disclosure.

FIG. 11 illustrates another example of an electronic device 700 including the amplifier 100, 200, 300, or 400 according to an embodiment of the present disclosure. Referring to FIG. 11, the electronic device 700 may be a buck-boost converter. The electronic device 700 may step up and step down the input voltage VIN so as to be output as the second output voltage VO to the second output node NO.

The electronic device 700 may include a first driving transistor 711, a second driving transistor 712, a first charging element 713, a second charging element 714, a first dividing resistor 715, a second dividing resistor 716, a reference voltage generator 717, an amplifier 718, a load resistor 719, a ramp voltage generator 720, a comparator 721, a pulse voltage generator 722, a flip-flop 723, a driver 724, a third driving transistor 725, and a fourth driving transistor 726.

The first driving transistor 711 may be turned on or turned off in response to the first voltage V1. When turned on, the first driving transistor 711 may transfer the input voltage VIN to the first charging element 713. The first driving transistor 711 may be, but is not limited to, a PMOS transistor.

The second driving transistor 712 may be turned on or turned off in response to the second voltage V2. When turned on, the second driving transistor 712 may sink a current from the first charging element 713 to the ground node to which the ground voltage GND is applied. The second driving transistor 712 may be, but is not limited to, an NMOS transistor.

The third driving transistor 725 may be turned on or turned off in response to a third voltage V4. The third driving transistor 725 may be, but is not limited to, a PMOS transistor. The fourth driving transistor 726 may be turned on or turned off in response to a fourth voltage V3. The fourth driving transistor 726 may be, but is not limited to, an NMOS transistor. The first charging element 713 may be an inductor. The second charging element 714 may be a capacitor.

The electronic device 700 may operate in one selected from a first mode, a second mode, and a third mode. The first mode may be a buck mode. In the first mode, the third driving transistor 725 and the fourth driving transistor 726 may maintain a turn-off state by the third voltage V3 and the fourth voltage V4. The first driving transistor 711 and the second driving transistor 712 may perform buck conversion, which is described with reference to FIG. 9, depending on the first voltage V1 and the second voltage V2.

The second mode may be a boost mode. In the second mode, the first driving transistor 711 and the second driving transistor 712 may maintain a turn-off state by the first voltage V1 and the second voltage V2. The third driving transistor 725 and the fourth driving transistor 726 may perform boost conversion, which is described with reference to FIG. 10, depending on the third voltage V3 and the fourth voltage V4.

The third mode may be a buck-boost mode. In the third mode, the first driving transistor 711 and the second driving transistor 712 may perform buck conversion, which is described with reference to FIG. 9, depending on the first voltage V1 and the second voltage V2. The third driving transistor 725 and the fourth driving transistor 726 may perform boost conversion, which is described with reference to FIG. 10, depending on the third voltage V3 and the fourth voltage V4.

The electronic device 700 may operate in one selected from the first mode, the second mode, and the third mode depending on a level of the input voltage VIN. When the input voltage VIN is greater than a first threshold voltage, the electronic device 700 may perform buck conversion in the first mode. When the input voltage VIN is smaller than a second threshold voltage, the electronic device 700 may perform boost conversion in the second mode. When the input voltage VIN is equal to or smaller than the first threshold voltage and is equal to or greater than the second threshold voltage, the electronic device 700 may perform buck-boost conversion in the third mode.

Operations and configurations of the first dividing resistor 715, the second dividing resistor 716, the reference voltage generator 717, the amplifier 718, the load resistor 719, the ramp voltage generator 720, the comparator 721, the pulse voltage generator 722, the flip-flop 723, and the driver 724 are the same as those of the first dividing resistor 515, the second dividing resistor 516, the reference voltage generator 517, the amplifier 518, the load resistor 519, the ramp voltage generator 520, the comparator 521, the pulse voltage generator 522, the flip-flop 523, and the driver 524, which are described with reference to FIG. 9. Thus, additional description will be omitted to avoid redundancy.

Figure 12:
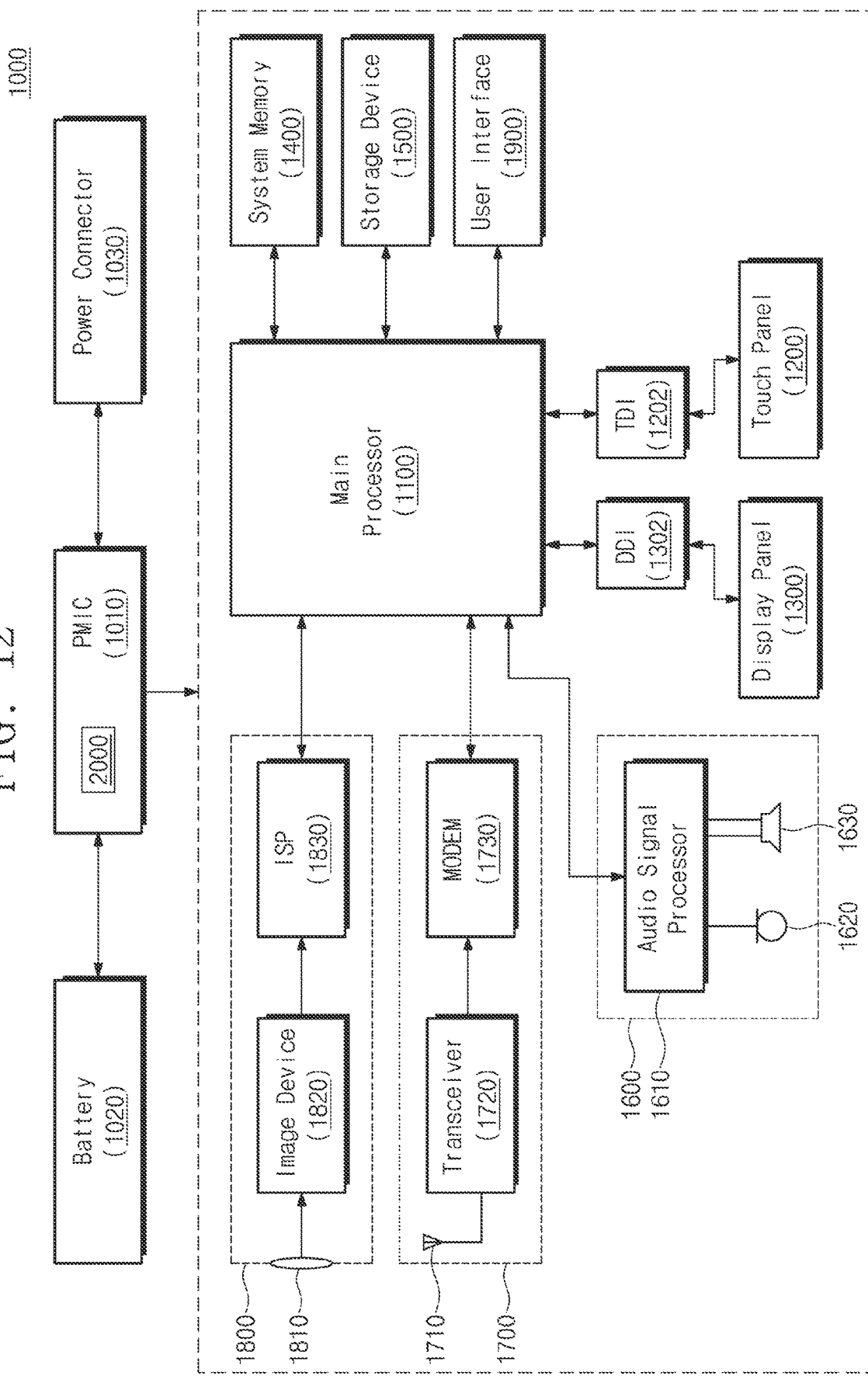
FIG. 12 illustrates an example of an electronic device including an electronic device of FIG. 9, an electronic device of FIG. 10, or an electronic device of FIG. 11.

FIG. 12 illustrates an example of an electronic device 1000 including the electronic device 500 of FIG. 9, the electronic device 600 of FIG. 10, or the electronic device 700 of FIG. 11. Referring to FIG. 12, the electronic device 1000 may include a main processor 1100, a touch panel 1200, a touch driver integrated circuit (TDI) 1202, a display panel 1300, a display driver integrated circuit (DDI) 1302, a system memory 1400, a storage device 1500, an audio processor 1600, a communication block 1700, an image processor 1800, and a user interface 1900. In an embodiment, the electronic device 1000 may be one of various electronic devices such as a personal computer, a laptop computer, a server, a workstation, a portable communication terminal, a personal digital assistant (PDA), a portable media player (PMP), a digital camera, a smartphone, a tablet computer, and a wearable device.

The main processor 1100 may control overall operations of the electronic device 1000. The main processor 1100 may control/manage operations of the components of the electronic device 1000. The main processor 1100 may process various operations for the purpose of operating the electronic device 1000. The touch panel 1200 may be configured to sense a touch input from a user under control of the touch driver integrated circuit 1202. The display panel 1300 may be configured to display image information under control of the display driver integrated circuit 1302.

The system memory 1400 may store data that are used in an operation of the electronic device 1000. For example, the system memory 1400 may include a volatile memory such as a static random access memory (SRAM), a dynamic RAM (DRAM), or a synchronous DRAM (SDRAM), and/or a nonvolatile memory such as a phase-change RAM (PRAM), a magneto-resistive RAM (MRAM), a resistive RAM (ReRAM), or a ferroelectric RAM (FRAM).

The storage device 1500 may store data regardless of whether power is supplied. For example, the storage device 1500 may include at least one of various nonvolatile memories such as a flash memory, a PRAM, an MRAM, a ReRAM, and a FRAM. For example, the storage device 1500 may include an embedded memory and/or a removable memory of the electronic device 1000.

The audio processor 1600 may process an audio signal by using an audio signal processor 1610. The audio processor 1600 may receive an audio input through a microphone 1620 or may provide an audio output through a speaker 1630. The communication block 1700 may exchange signals with an external device/system through an antenna 1710. A transceiver 1720 and a modulator/demodulator (MODEM) 1730 of the communication block 1700 may process signals exchanged with the external device/system, based on at least one of various wireless communication protocols: long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 1800 may receive a light through a lens 1810. An image device 1820 and an image signal processor (ISP) 1830 included in the image processor 1800 may generate image information about an external object, based on a received light. The user interface 1900 may include an interface capable of exchanging information with a user, except for the touch panel 1200, the display panel 1300, the audio processor 1600, and the image processor 1800. The user interface 1900 may include a keyboard, a mouse, a printer, a projector, various sensors, a human body communication device, etc.

The electronic device 1000 may further include a power management IC (PMIC) 1010, a battery 1020, and a power connector 1030. The power management IC 1010 may generate internal power from power supplied from the battery 1020 or power supplied from the power connector 1030, and may provide the internal power to the main processor 1100, the touch panel 1200, the touch driver integrated circuit (TDI) 1202, the display panel 1300, the display driver integrated circuit (DDI) 1302, the system memory 1400, the storage device 1500, the audio processor 1600, the communication block 1700, the image processor 1800, and the user interface 1900.

The power management IC 1010 may include an electronic device 2000. The electronic device 2000 may include the electronic device 500 described with reference to FIG. 9, the electronic device 600 described with reference to FIG. 10, or the electronic device 700 described with reference to FIG. 11. The electronic device 500, 600, or 700 may include the amplifier 100, 200, 300, or 400 according to an embodiment of the present disclosure. The amplifier 100, 200, 300, or 400 may compensate for a change of temperature or a voltage. Accordingly, the stability of the amplifier 100, 200, 300, or 400 may be improved. Also, the stability of the electronic device 500, 600, 700, 2000, or 1000 including the amplifier 100, 200, 300, or 400 may be improved.

Each of the components of the electronic device 1000 may include a safety monitor device. Also, the safety monitor device may be connected with each of channels between the components of the electronic device 1000. The safety monitor device may check the integrity of a signal, a voltage, or a current of each component or between components. The electronic device 1000 may be implemented in an in-vehicle infotainment system. The safety monitor device SM may be implemented based on the ISO26262 or ASIL (Automotive Safety Integrity Level).

Alternatively, the electronic device 1000 may be implemented with various mobile devices such as a smartphone and a smart pad. Also, the electronic device 1000 may be implemented with various wearable devices such as a smart watch, smart glasses, and a virtual reality goggles.

In the above embodiments, components according to the present disclosure are described by using the terms "first", "second", "third", and the like. However, the terms "first", "second", "third", and the like may be used to distinguish components from each other and do not limit the present disclosure. For example, the terms "first", "second", "third", and the like do not involve an order or a numerical meaning of any form.

In the above embodiments, components according to embodiments of the present disclosure are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to the present disclosure, a change of a transconductance of an amplifier is compensated based on a change of a resistance value of a resistor and a change of a resistance value of a transistor due to temperature change. Accordingly, an amplifier having no influence of temperature change is provided. Also, according to the present disclosure, the amplifier is biased based on a voltage drop amount. Accordingly, an amplifier having no influence of a voltage change is provided.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An amplifier comprising:
    an input circuit configured to amplify a difference between a first input voltage and a second input voltage to generate a first current and a second current;
    a positive feedback circuit configured to amplify a difference between the first current and the second current to generate a third current and a fourth current and to output a difference between the third current and the fourth current through an output node; and
    a temperature compensation circuit configured to adjust an amplification factor of the positive feedback circuit in response to a change of temperature.

2. The amplifier of claim 1, wherein the temperature compensation circuit reduces a change of a total transconductance of the amplifier due to the change of temperature.

3. The amplifier of claim 1, wherein the temperature compensation circuit includes:
    resistors configured to transfer a power supply voltage or a ground voltage to the positive feedback circuit; and
    transistors configured to transfer the power supply voltage or the ground voltage to the positive feedback circuit.

4. The amplifier of claim 3, wherein a degree to which resistance values of the resistors change depending on the change of temperature is different from a degree to which resistance values of the transistors change depending on the change of temperature.

5. The amplifier of claim 3, wherein the transistors are biased to maintain a triode state.

6. The amplifier of claim 3, further comprising a voltage compensation circuit configured to uniformly maintain a difference between the power supply voltage and a bias voltage to be applied to the transistors even though the power supply voltage changes.

7. The amplifier of claim 1, wherein the input circuit includes:
    a current source;
    a first transistor configured to allow a first intermediate current to flow from the current source in response to the first input voltage;
    a second transistor configured to allow a second intermediate current to flow from the current source in response to the second input voltage;
    a first current mirror configured to sink the first current based on the first intermediate current; and
    a second current mirror configured to sink the second current based on the second intermediate current.

8. The amplifier of claim 1, wherein the positive feedback circuit includes:
    a first transistor including a first terminal connected with a first node from which the first current is sunk, a second terminal connected with the temperature compensation circuit, and a gate connected with a second node from which the second current is sunk;
    a second transistor including a first terminal connected with the second node, a second terminal connected with the temperature compensation circuit, and a gate connected with the first node;

a first current mirror connected with the first node and configured to output an intermediate current based on the first current and a current flowing through the first transistor;
a second current mirror connected with the second node and configured to output the fourth current based on the second current and a current flowing through the second transistor; and
a third current mirror configured to sink the third current based on the intermediate current.

9. The amplifier of claim 8, wherein the temperature compensation circuit includes:
a first resistor connected between a power node and the first transistor;
a second resistor connected between the power node and the second transistor;
third transistors connected between the power node and the first current mirror; and
fourth transistors connected between the power node and the second current mirror.

10. The amplifier of claim 9, further comprising:
a voltage compensation circuit including a third resistor and a current source connected between the power node and a ground node, wherein
gates of the third transistors and the fourth transistors are biased by a voltage of a node between the third resistor and the current source.

11. The amplifier of claim 1, wherein the input circuit includes:
a current source;
a first transistor configured to allow a first intermediate current to flow to the current source in response to the first input voltage;
a second transistor configured to allow a second intermediate current to flow to the current source in response to the second input voltage;
a first current mirror configured to output the first current based on the first intermediate current; and
a second current mirror configured to output the second current based on the second intermediate current.

12. The amplifier of claim 1, wherein the positive feedback circuit includes:
a first transistor including a first terminal connected to a first node where the first current is output, a second terminal connected with the temperature compensation circuit, and a gate connected with a second node where the second current is output;
a second transistor including a first terminal connected with the second node, a second terminal connected with the temperature compensation circuit, and a gate connected with the first node;
a first current mirror connected with the first node and configured to sink an intermediate current based on the first current and a current flowing through the first transistor;
a second current mirror connected with the second node and configured to sink the fourth current based on the second current and a current flowing through the second transistor; and
a third current mirror configured to output the third current based on the intermediate current.

13. The amplifier of claim 12, wherein the temperature compensation circuit includes:
a first resistor connected between the first transistor and a ground node;
a second resistor connected between the second transistor and the ground node;
third transistors connected between the first current mirror and the ground node; and
fourth transistors connected between the second current mirror and the ground node.

14. The amplifier of claim 13, further comprising:
a voltage compensation circuit including a third resistor and a current source connected between a power node and the ground node, wherein
gates of the third transistors and the fourth transistors are biased by a voltage of a node between the third resistor and the current source.

15. An electronic device comprising:
an amplifier;
a temperature compensation circuit configured to compensate for a change of an amplification factor of the amplifier due to a change of temperature; and
a voltage compensation circuit configured to compensate for a change of the amplification factor of the amplifier due to a change of a power supply voltage, wherein:
the amplifier includes:
a current source;
a first transistor configured to generate a first current from the current source in response to a first input voltage;
a second transistor configured to generate a second current from the current source in response to a second input voltage;
a first current mirror configured to sink a third current based on the first current;
a second current mirror configured to sink a fourth current based on the second current;
a third transistor including a first terminal at which the third current is generated, a second terminal connected with the temperature compensation circuit, and a gate connected with a second node at which the second current is generated;
a fourth transistor including a first terminal connected with the second node, a second terminal connected with the temperature compensation circuit, and a gate connected with the first node;
a third current mirror connected with the first node and configured to generate a fifth current based on the first current and a current flowing through the first transistor;
a fourth current mirror connected with the second node and configured to generate a sixth current based on the second current and a current flowing through the second transistor; and
a fifth current mirror configured to generate a seventh current based on the fifth current, and
the amplifier outputs a difference between the sixth current and the seventh current.

16. The electronic device of claim 15, wherein the temperature compensation circuit includes:
a first resistor connected between the first transistor and a power node or a ground node;
a second resistor connected between the second transistor and the power node or the ground node;
third transistors connected between the first current mirror and the power node or the ground node; and
fourth transistors connected between the second current mirror and the power node or the ground node.

17. The electronic device of claim 16, further comprising:
a voltage compensation circuit including a third resistor and a current source connected between the power node and the ground node, wherein gates of the third transistors and the fourth transistors are biased by a voltage of a node between the third resistor and the current source.

18. An electronic device comprising:
- a processor configured to drive an operating system and applications;
- a display device configured to display a first image and generate a second image under control of the processor;
- an audio device configured to output a first audio signal and generate a second audio signal under control of the processor;
- a system memory used in an operation of the processor;
- a storage device including a nonvolatile memory storing data under control of the processor; and
- a power management circuit configured to supply a power to at least one of the processor, the display device, the audio device, the system memory, and the storage device, wherein:

the power management circuit includes an amplifier, and the amplifier includes:

- an input circuit configured to amplify a difference between a first input voltage and a second input voltage to generate a first current and a second current;
- a positive feedback circuit configured to amplify a difference between the first current and the second current to generate a third current and a fourth current and to output a difference between the third current and the fourth current through an output node; and
- a temperature compensation circuit configured to adjust an amplification factor of the positive feedback circuit in response to a change of temperature.

19. The electronic device of claim 18, wherein:
the power management circuit includes at least one converter of a buck converter, a boost converter, or a buck-boost converter, and
the amplifier is included in the at least one converter.

20. The electronic device of claim 18, wherein the electronic device is implemented with a vehicle-in-infotainment device or a mobile device.

* * * * *